US012745410B2

(12) United States Patent
Gatto

(10) Patent No.: US 12,745,410 B2
(45) Date of Patent: Sep. 22, 2026

(54) GATE-CONTROLLED DIODE AND ELECTRONIC CIRCUIT

(71) Applicant: Mitsubishi Electric Corporation, Tokyo (JP)

(72) Inventor: Ayanori Gatto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 86 days.

(21) Appl. No.: 19/000,654

(22) Filed: Dec. 23, 2024

(65) Prior Publication Data

US 2025/0318163 A1 Oct. 9, 2025

(30) Foreign Application Priority Data

Apr. 4, 2024 (JP) ................................ 2024-060908

(51) Int. Cl.
*H10D 12/00* (2025.01)
*H10D 64/00* (2025.01)

(52) U.S. Cl.
CPC ......... *H10D 12/212* (2025.01); *H10D 64/117* (2025.01)

(58) Field of Classification Search
None
See application file for complete search history.

(56) References Cited

U.S. PATENT DOCUMENTS 8,072,241 B2 * 12/2011 Kouno ................. H10D 12/481 326/118
8,569,117 B2 * 10/2013 Akiyama ........... H10D 84/0105 438/137
10,840,386 B2 * 11/2020 Miyake .................... H10D 8/60
11,282,937 B2 * 3/2022 Mori ...................... H10D 64/64
2014/0084336 A1 * 3/2014 Matsudai ............. H10D 12/411 257/140
2024/0274708 A1 * 8/2024 Furukawa ............ H10D 12/211

FOREIGN PATENT DOCUMENTS

EP 4071813 A1 10/2022
JP 2021-090026 A 6/2021

* cited by examiner

*Primary Examiner* — Thomas J. Hiltunen
(74) *Attorney, Agent, or Firm* — Studebaker Brackett PLLC

(57) ABSTRACT

An object is to increase a tolerance of a gate pulse width in a gate-controlled diode while suppressing detrimental effects on other main electrical characteristics. A gate-controlled diode includes: a diode gate electrode buried in each of first trenches through an oxide film in a first active region; an anode electrode buried in each of second trenches through the oxide film in a second active region; a P type channel layer formed in a surface layer of an $N^-$ type semiconductor substrate; and an $N^+$ type layer formed in a surface layer of the P type channel layer in the first active region. An area of the first active region is 20% or higher and 80% or lower of a sum of the area of the first active region and an area of the second active region.

5 Claims, 21 Drawing Sheets

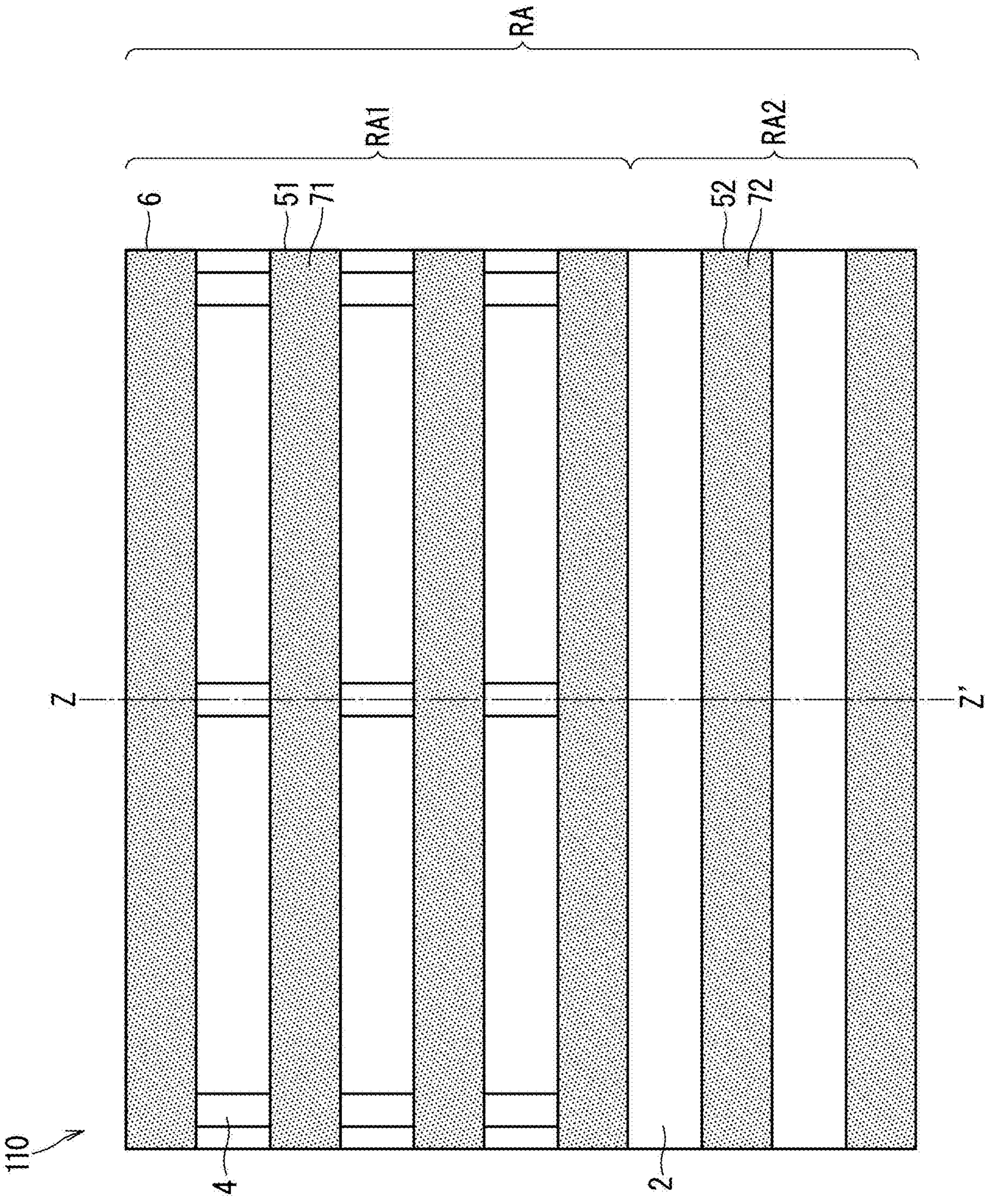
F I G. 4

F I G. 5
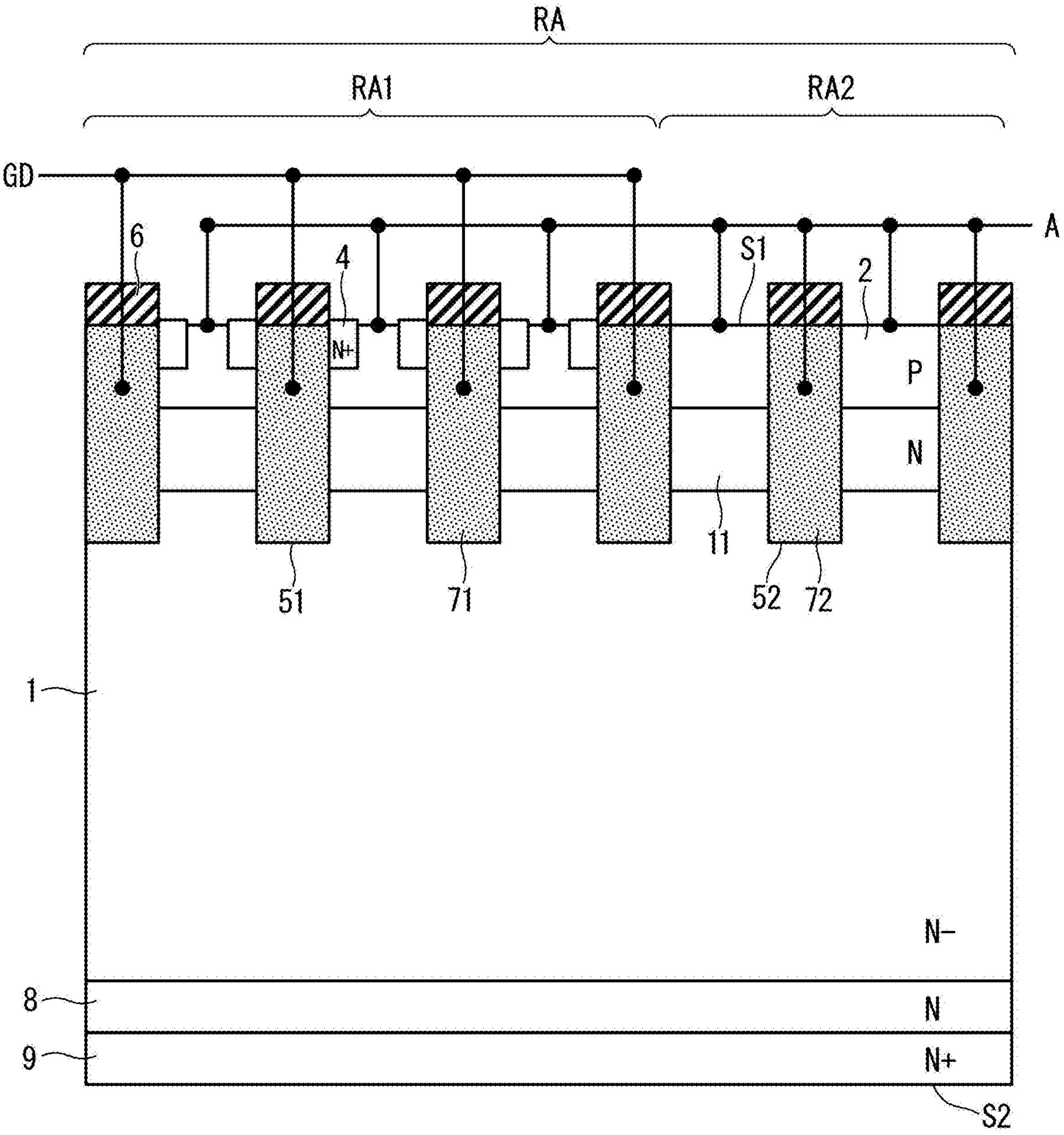

F I G. 8
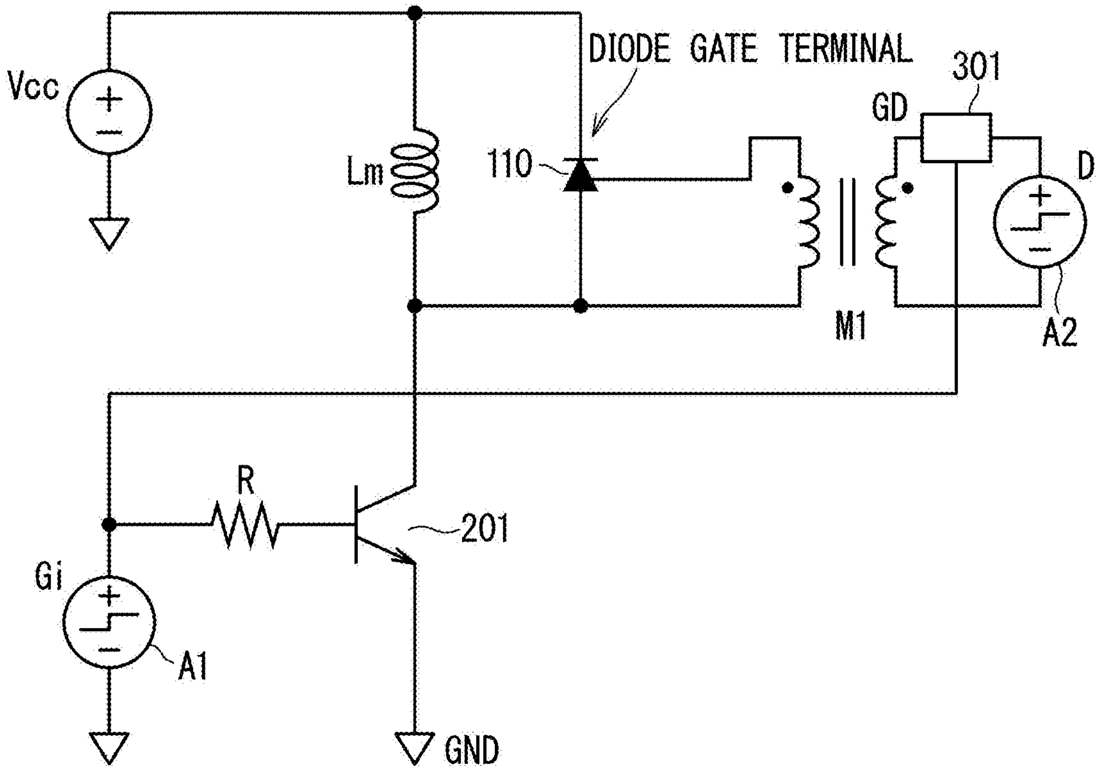
F I G. 9
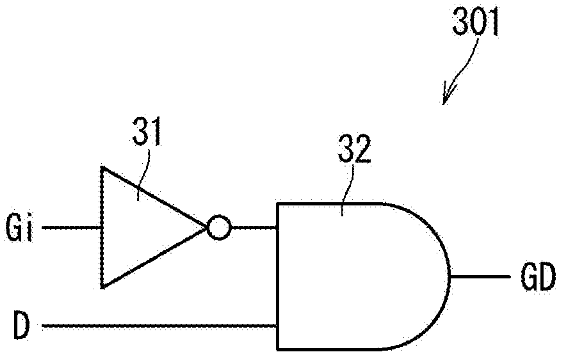

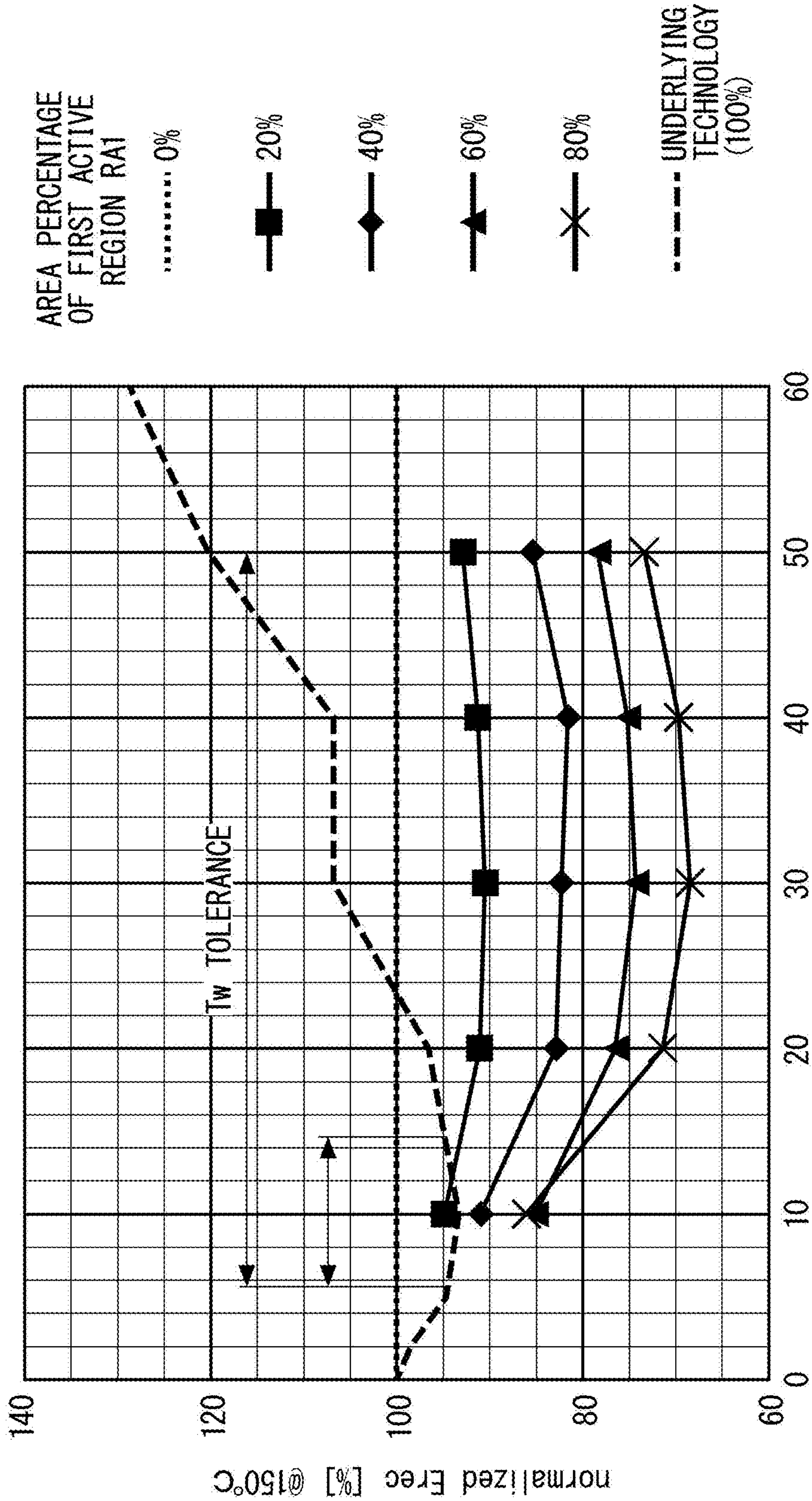
F I G. 1 3
normalized Erec [%] @150°C
140
120
100
80
60
0
10
20
30
40
50
60
Tw [μs]
Tw TOLERANCE
AREA PERCENTAGE
OF FIRST ACTIVE
REGION RA1
0%
20%
40%
60%
80%
UNDERLYING
TECHNOLOGY
(100%)

F I G. 20
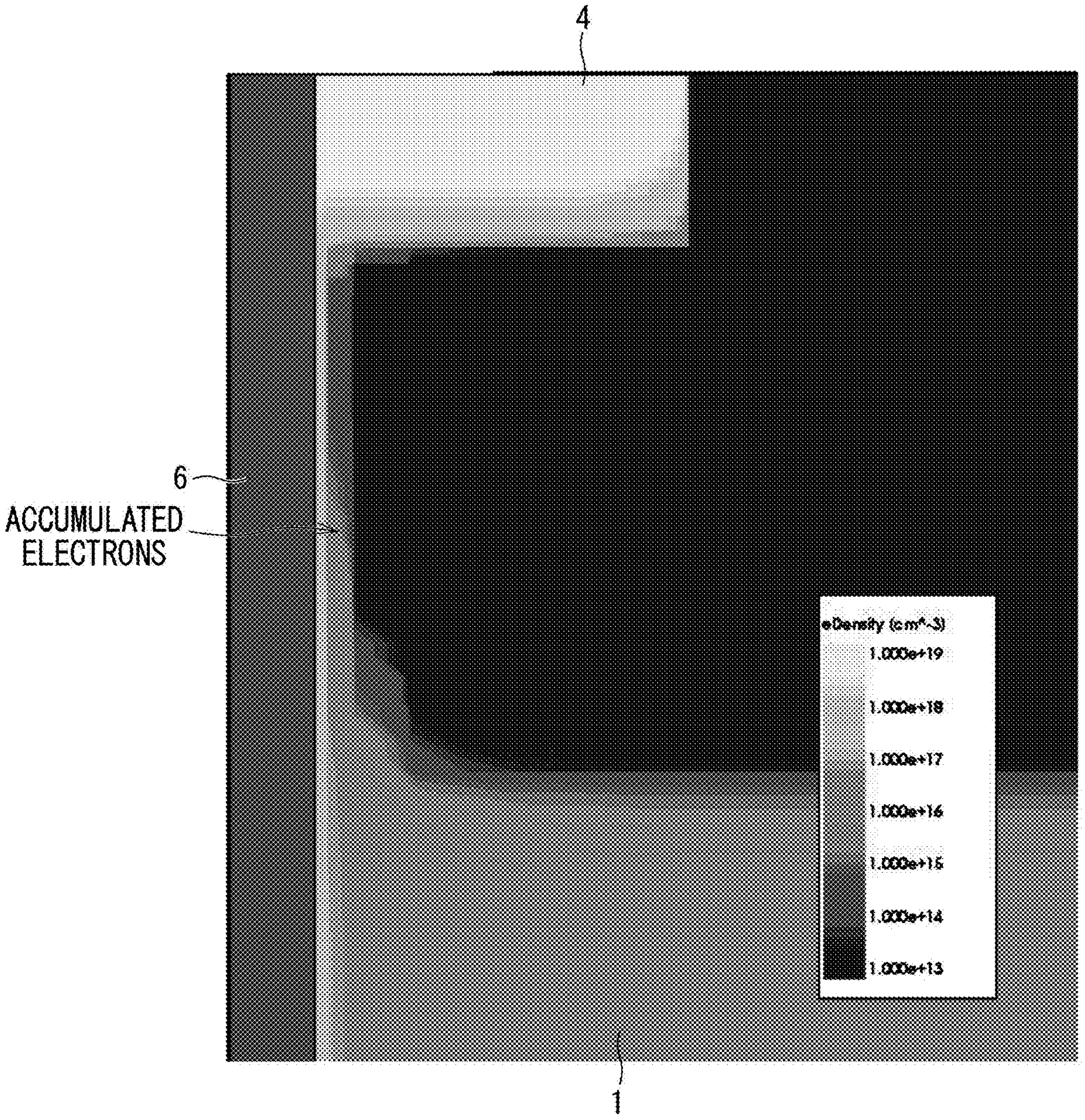

F I G. 25
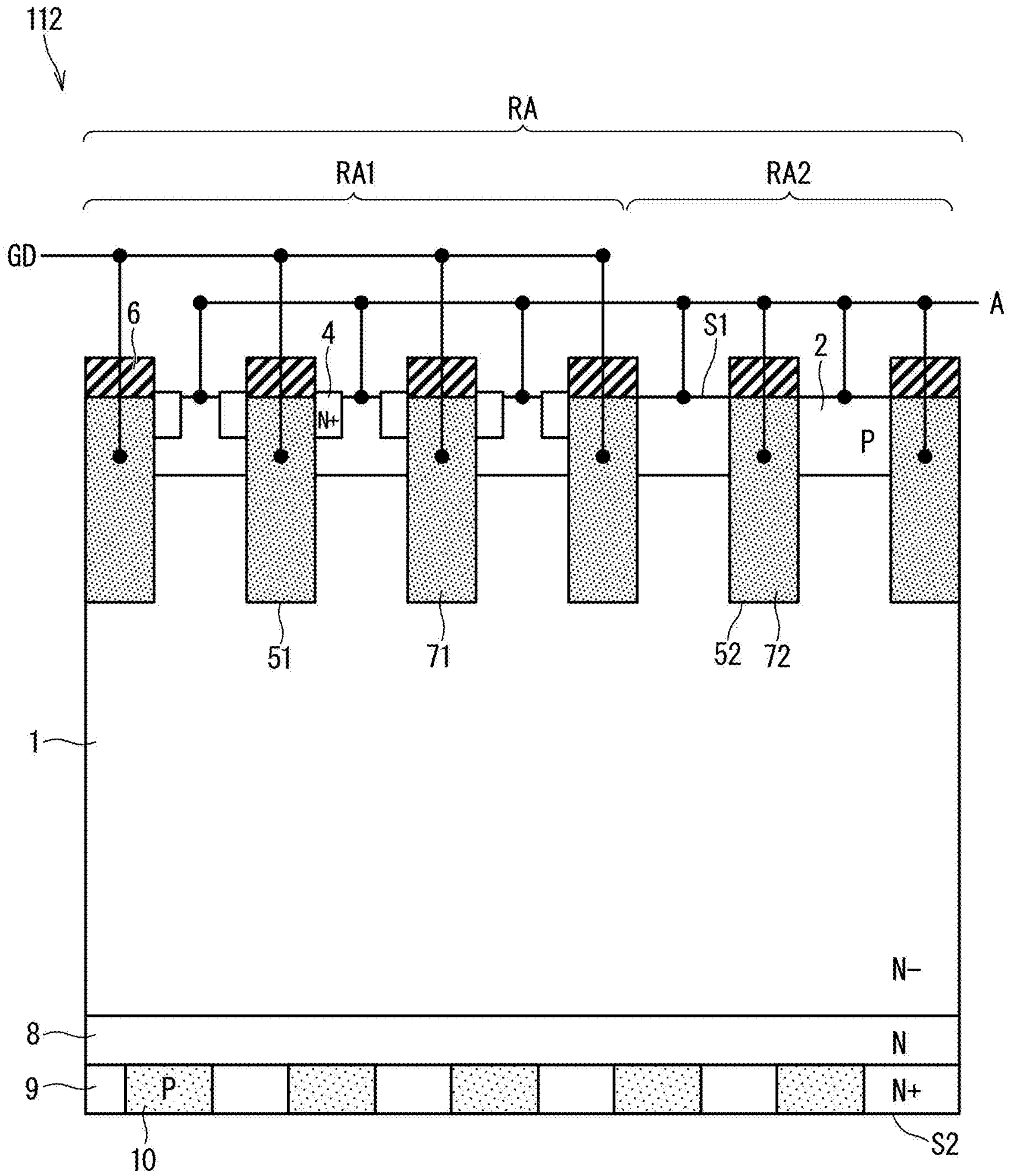

GATE-CONTROLLED DIODE AND ELECTRONIC CIRCUIT

BACKGROUND OF THE INVENTION

Field of the Invention

The present disclosure relates to a gate-controlled diode.

Description of the Background Art

FIGS. 7A and 7B in Japanese Patent Application Laid-Open No. 2021-90026 illustrate a gate-controlled diode including an $N^-$ type cathode drift layer, a $P^-$ type anode layer adjacent to the $N^-$ type cathode drift layer in the longitudinal direction, and an $N^+$ cathode layer adjacent to the $N^-$ type cathode drift layer in the longitudinal direction on the opposite side of the $P^-$ type anode layer.

In such a gate-controlled diode, ON/OFF operations of a gate disposed on an anode side control a carrier concentration on the anode side. When, for example, a MOSFET is of an n-channel and a diode is conducting, the MOSFET performs an OFF operation with application of a negative voltage to the gate. Thus, holes are accumulated in the channel of the MOSFET, and the holes are injected into an $N^-$ type semiconductor substrate to reduce conduction losses.

Prior to a recovery operation of the diode, the MOSFET performs an ON operation with application of a positive voltage to the gate. Thus, electrons are accumulated in the channel of the MOSFET, and a short-circuit of an anode p-n junction or injecting electrons into the $N^-$ type semiconductor substrate reduces recovery losses.

When the ON time of the gate, which is expressed by a gate pulse width, is prolonged prior to the recovery operation of the diode, a depletion layer extends toward the anode. This causes a problem of an increase in conduction losses. When the gate pulse width is shortened, the effect of reducing recovery losses is suppressed. This causes a problem of a narrow tolerance of the gate pulse width.

SUMMARY

The present disclosure has an object of increasing a tolerance of a gate pulse width in a gate-controlled diode while suppressing detrimental effects on other main electrical characteristics.

A gate-controlled diode according to the present disclosure includes: a semiconductor substrate of a first conductivity type; an active region; a cathode layer of the first conductivity type; and a buffer layer of the first conductivity type. The active region is formed in a first main surface of the semiconductor substrate. The cathode layer is formed in a second main surface of the semiconductor substrate, the second main surface being a main surface opposite to the first main surface. The buffer layer is formed between the cathode layer and the semiconductor substrate. The active region is divided into a first active region and a second active region in a plan view. The gate-controlled diode according to the present disclosure includes a plurality of first trenches, a diode gate electrode, a plurality of second trenches, an anode electrode, a channel layer of a second conductivity type, and a layer of the first conductivity type. The plurality of first trenches are formed at regular intervals in the first main surface of the semiconductor substrate in the first active region. The diode gate electrode is buried in each of the first trenches through an oxide film. The plurality of second trenches are formed at regular intervals in the first main surface of the semiconductor substrate in the second active region. The anode electrode is buried in each of the second trenches through the oxide film. The channel layer is formed in a surface layer of the semiconductor substrate between adjacent two of the first trenches and between adjacent two of the second trenches, the channel layer being electrically connected to the anode electrode. The layer of the first conductivity type is formed in a surface layer of the channel layer in the first active region. An area of the first active region is 20% or higher and 80% or lower of a sum of the area of the first active region and an area of the second active region.

The gate-controlled diode according to the present disclosure can increase the tolerance of the gate pulse width while suppressing the detrimental effects on the other main electrical characteristics.

These and other objects, features, aspects, and advantages of the present disclosure will become more apparent from the following detailed description of the present disclosure when taken in conjunction with the accompanying drawings.

BRIEF DESCRIPTION OF THE DRAWINGS

FIG. 4 is a plan view of a gate-controlled diode according to Embodiment 1;

FIG. 5 is a cross-sectional view of the gate-controlled diode which is taken along a line Z-Z' of FIG. 4;

FIG. 8 is a circuit diagram of the gate-controlled diode and its peripheral structure to be used in the second sequence;

FIG. 9 illustrates a specific structure of a control circuit;

FIG. 13 illustrates a relationship between normalized Erec and Tw for each area percentage of the first active region;

FIG. 20 is an enlarged view of a dotted-line portion in FIG. 18;

FIG. 25 is a cross-sectional view of a gate-controlled diode according to a second modification of Embodiment 1.

DESCRIPTION OF THE PREFERRED EMBODIMENTS

A. Underlying Technology

Figure 1:
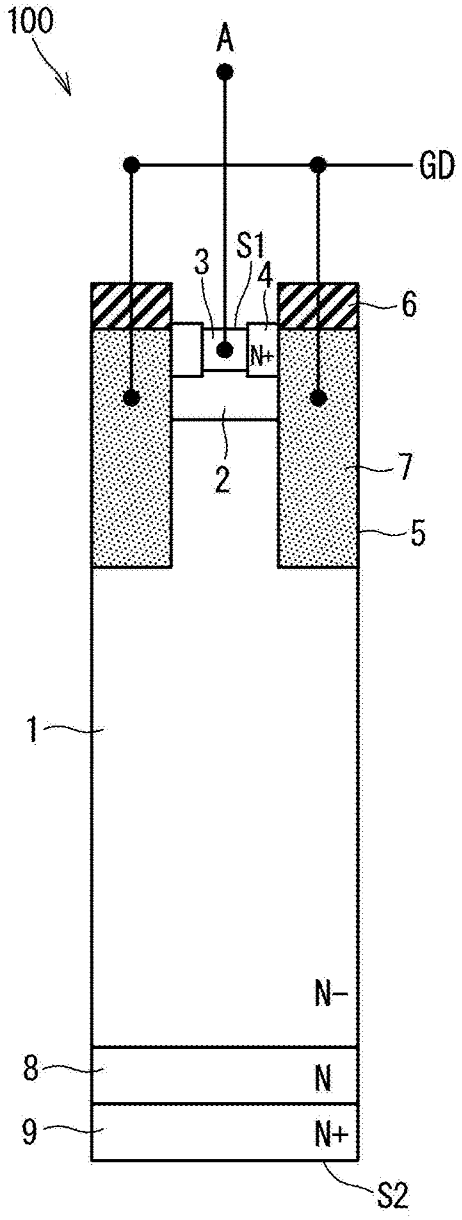
FIG. 1 is a cross-sectional view of a gate-controlled diode according to an underlying technology.

FIG. 1 is a cross-sectional view of a gate-controlled diode 100 according to an underlying technology. As illustrated in FIG. 1, the gate-controlled diode 100 includes an $N^-$ type semiconductor substrate 1, a P type channel layer 2 formed in a surface layer of the $N^-$ type semiconductor substrate 1 on the first main surface S1 side, and a $P^+$ type layer 3 and an $N^+$ type layer 4 that are formed in a surface layer of the P type channel layer 2. The upper surface of the $P^+$ type layer 3 and the $N^+$ type layer 4 makes up the first main surface S1 of the $N^-$ type semiconductor substrate 1. A plurality of trenches 5 reaching the $N^-$ type semiconductor substrate 1 from the upper surface of the $N^+$ type layer 4 through the $N^+$ type layer 4 and the P type channel layer 2 are formed at regular intervals. In each of the trenches 5, polysilicon 7 is buried through an oxide film 6. This polysilicon 7 functions as a gate electrode of the gate-controlled diode 100, and receives a diode gate control signal GD. The $P^+$ type layer 3 receives an anode signal A.

An N type buffer layer 8 and an $N^+$ type cathode layer 9 are formed on the second main surface S2 side with respect to the $N^-$ type semiconductor substrate 1. The lower surface of the $N^+$ type cathode layer 9 makes up the second main surface S2 of the $N^-$ type semiconductor substrate 1. The N type buffer layer 8 is formed between the $N^+$ type cathode layer 9 and the $N^-$ type semiconductor substrate 1.

Figure 2:
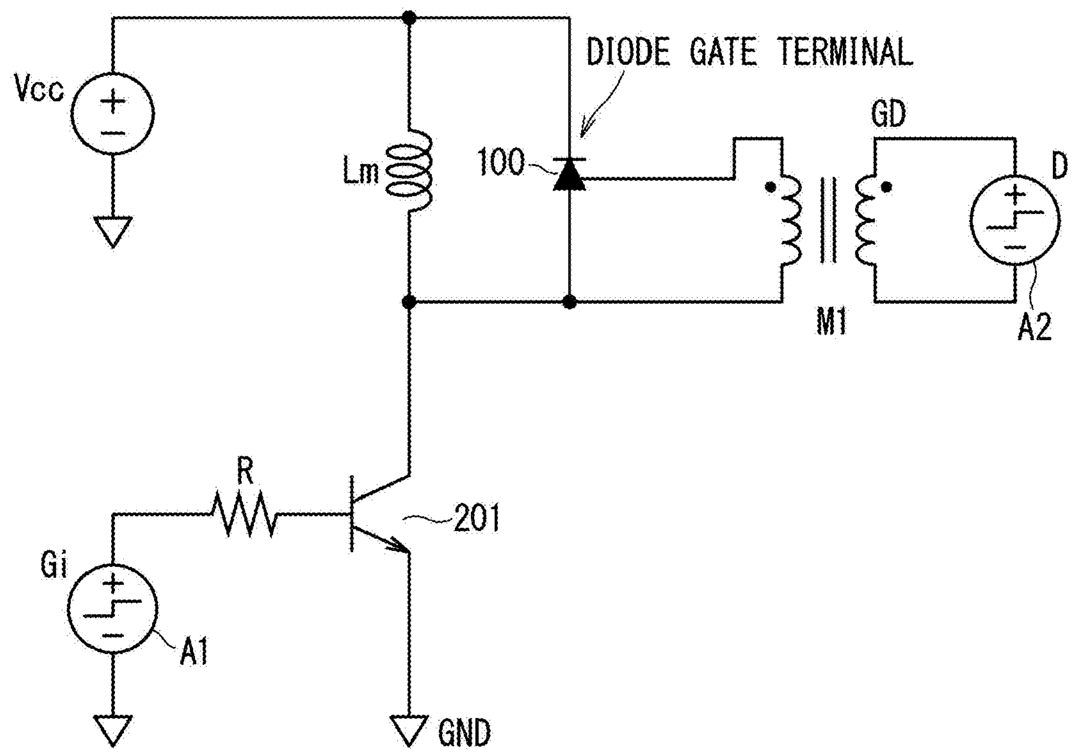
FIG. 2 is a circuit diagram of an electronic circuit including the gate-controlled diode according to the underlying technology.

FIG. 2 is a circuit diagram of an electronic circuit including the gate-controlled diode 100. A cathode of the gate-controlled diode 100 is connected to a power supply Vcc. Furthermore, a load inductance is connected between the cathode and an anode of the gate-controlled diode 100.

Furthermore, an insulated-gate bipolar transistor (IGBT) is connected between the anode of the gate-controlled diode 100 and the GND. This IGBT will be referred to as a pair IGBT 201. A collector electrode of the pair IGBT 201 is connected to the anode of the gate-controlled diode 100, and an emitter of the pair IGBT 201 is connected to the GND. A gate terminal of the pair IGBT 201 is connected through a resistor R to a first signal source A1 that outputs a gate signal Gi of the pair IGBT 201.

A gate of the gate-controlled diode 100 is connected to a primary side of a choke coil M1. A secondary side of the choke coil M1 is connected to a second signal source A2 that outputs a diode gate signal D. The first signal source A1 and the second signal source A2 are independent signal sources. The diode gate signal D output from the second signal source A2 is input to the choke coil M1 as a diode gate control signal GD. The diode gate signal D is equal to the diode gate control signal GD in the underlying technology. The diode gate control signal GD of which voltage has been converted by the choke coil M1 is input to the gate of the gate-controlled diode 100.

Figure 3:
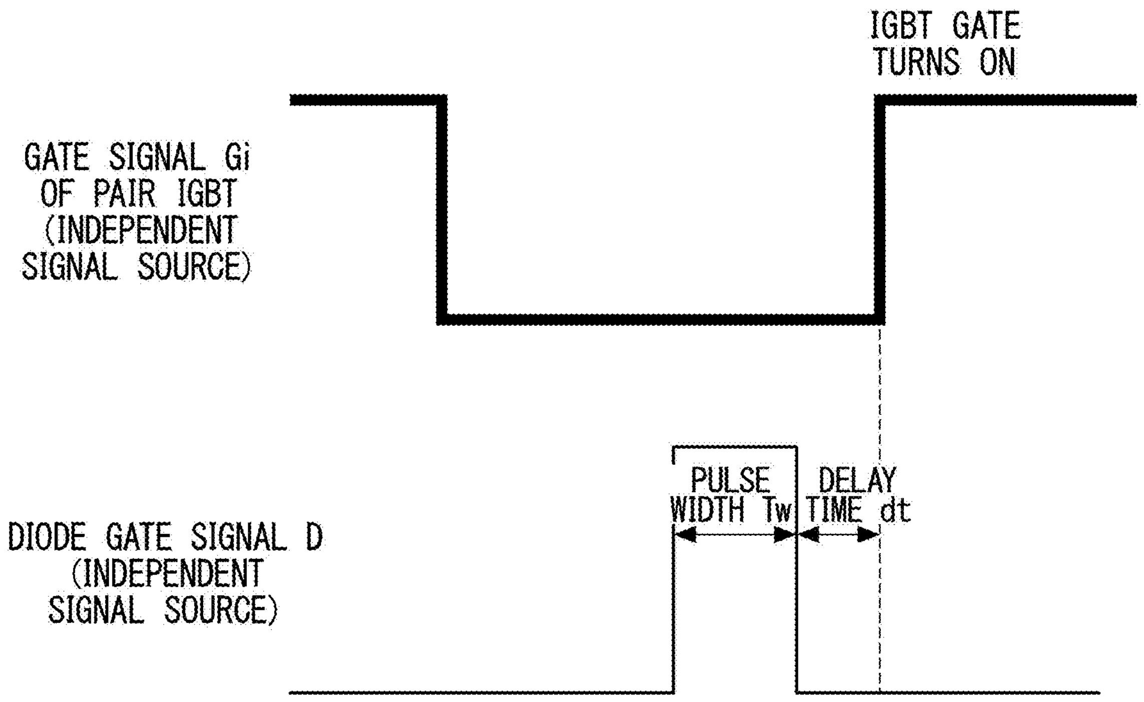
FIG. 3 illustrates waveforms of a gate signal of a pair IGBT and a diode gate signal according to the underlying technology.

FIG. 3 illustrates waveforms of the gate signal Gi of the pair IGBT 201 and the diode gate signal D. As illustrated in FIG. 3, before the gate signal Gi of the pair IGBT 201 becomes a high level, that is, before the gate of the pair IGBT 201 turns ON, the diode gate signal D at a high level, that is, a turn-on pulse is applied to the gate of the gate-controlled diode 100.

In the gate-controlled diode 100, ON/OFF operations of the gate disposed on the anode side control a carrier concentration on the anode side. When, for example, a MOSFET is of an n-channel and a diode is conducting, the MOSFET performs an OFF operation with application of a negative voltage to the gate. Thus, holes are accumulated in the channel of the MOSFET, and the holes are injected into the $N^-$ type semiconductor substrate 1 to reduce conduction losses.

Prior to a recovery operation of the diode, the MOSFET performs an ON operation with application of a positive voltage to the gate. Thus, electrons are accumulated in the channel of the MOSFET, and a short-circuit of an anode p-n junction or injecting electrons into the $N^-$ type semiconductor substrate 1 reduces recovery losses.

When the ON time of the gate, which is expressed by the gate pulse width Tw, is prolonged prior to the recovery operation of the diode, a depletion layer extends toward the anode. This causes a problem of an increase in conduction losses. When the gate pulse width Tw is shortened, the effect of reducing recovery losses is suppressed. This causes a problem of a narrow tolerance of the gate pulse width Tw.

Here, Embodiment 1 below will describe a structure of increasing the tolerance of the gate pulse width Tw in a gate-controlled diode while suppressing detrimental effects on other main electrical characteristics.

B. Embodiment 1

In Embodiment 1, N type is a first conductivity type, and P type is a second conductivity type as semiconductor conductivity types. $N^+$ type represents an n-type impurity concentration higher than that of N type, and $N^-$ type represents an n-type impurity concentration lower than that of N type. Similarly, $P^+$ type represents a p-type impurity concentration higher than that of P type, and $P^-$ type represents a p-type impurity concentration lower than that of P type. The semiconductor conductivity types may be reverse. In other words, N type may be the second conductivity type, and P type may be the first conductivity type.

[B-1. Structure]

FIG. 4 is a plan view of a gate-controlled diode 110 according to Embodiment 1. FIG. 4 illustrates only an active region RA of the gate-controlled diode 110. Illustration of any breakdown voltage retention structure disposed around the active region RA or a structure of, for example, gate lines is omitted. FIG. 5 is a cross-sectional view of the gate-controlled diode 110 which is taken along a line Z-Z' of FIG. 4.

Hereinafter, a structure of the gate-controlled diode 110 will be described with reference to FIGS. 4 and 5. The gate-controlled diode 110 includes the $N^-$ type semiconductor substrate 1. The active region RA is disposed in the first main surface S1 of the $N^-$ type semiconductor substrate 1.

The active region RA includes a first active region RA1 and a second active region RA2. The active region RA is divided into the first active region RA1 and the second active region RA2 in a plan view.

In the first active region RA1 and the second active region RA2, an N type layer 11, the P type channel layer 2, and the $N^+$ type layer 4 are disposed on the first main surface S1 side with respect to the $N^-$ type semiconductor substrate 1. The N type layer 11 is formed between the $N^-$ type semiconductor substrate 1 and the P type channel layer 2, and the $N^+$ type layer 4 is formed in a part of a surface layer of the P type channel layer 2. The upper surface of the $N^+$ type layer 4 and the P type channel layer 2 makes up the first main surface S1 of the $N^-$ type semiconductor substrate 1.

A plurality of trenches reaching the $N^-$ type semiconductor substrate 1 from the first main surface S1 of the $N^-$ type semiconductor substrate 1 through the P type channel layer 2 and the N type layer 11 are formed at regular intervals. Among these trenches, the trenches formed in the first active region RA1 will be referred to as first trenches 51, and the trenches formed in the second active region RA2 will be referred to as second trenches 52. In the first trenches 51, first polysilicon 71 is buried through the oxide film 6. In the second trenches 52, second polysilicon 72 is buried through the oxide film 6.

This first polysilicon 71 functions as a gate electrode of the gate-controlled diode 110, and receives the diode gate control signal GD. A gate electrode of a gate-controlled diode may be referred to as a diode gate electrode. The P type channel layer 2 in the first active region RA1 and the second active region RA2, and the second polysilicon 72 receive an anode signal. In other words, the second polysilicon 72 functions as an anode electrode of the gate-controlled diode 110.

The N type buffer layer 8 and the $N^+$ type cathode layer 9 are formed on the second main surface S2 side with respect to the $N^-$ type semiconductor substrate 1. The lower surface of the $N^+$ type cathode layer 9 makes up the second main surface S2 of the $N^-$ type semiconductor substrate 1. The N type buffer layer 8 is formed between the $N^+$ type cathode layer 9 and the $N^-$ type semiconductor substrate 1. An area of the first active region RA1 is 20% or higher and 80% or lower of a sum of the area of the first active region RA1 and an area of the second active region RA2, that is, an area of the active region RA.

[B-2. Sequences]

First and second sequences will be described as sequences of the diode gate control signal GD to be received by the gate-controlled diode 110.

Figure 6:
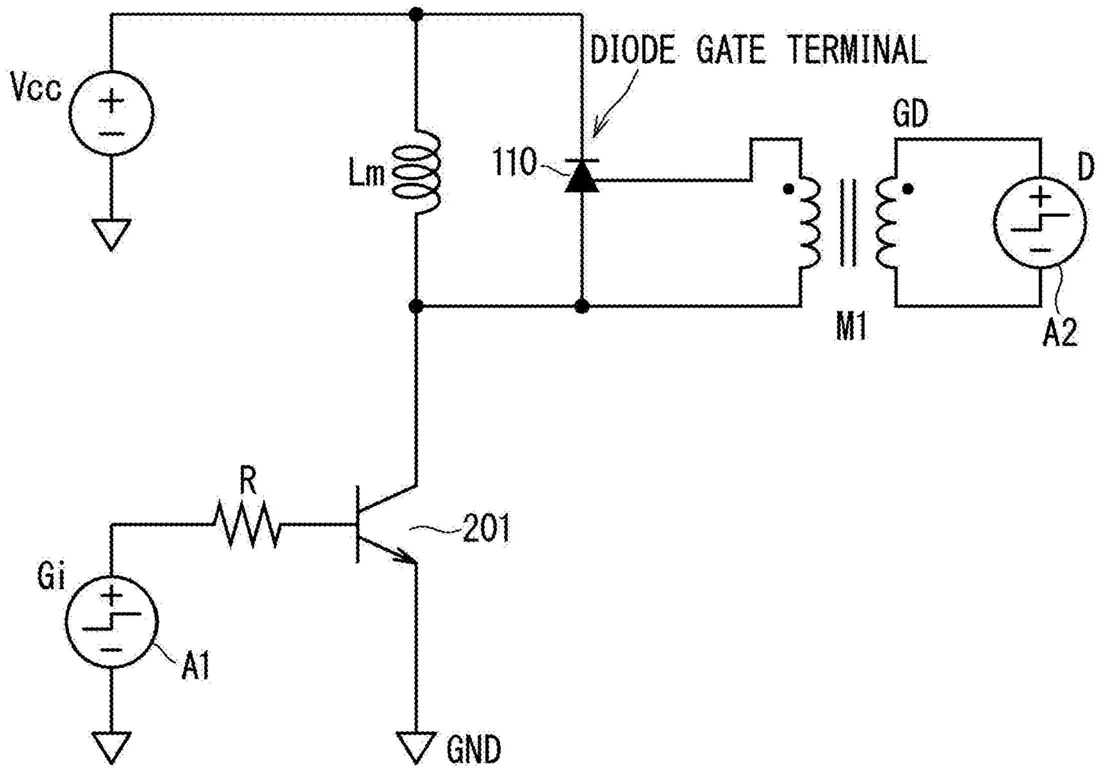
FIG. 6 is a circuit diagram of the gate-controlled diode and its peripheral structure to be used in the first sequence.

FIG. 6 is a circuit diagram of the gate-controlled diode 110 and its peripheral structure to be used in the first sequence. In other words, FIG. 6 is a circuit diagram of an electronic circuit including the gate-controlled diode 110. FIG. 6 is obtained by replacing the gate-controlled diode 100 with the gate-controlled diode 110 in the circuit diagram of FIG. 2. In other words, the diode gate control signal GD is equal to the diode gate signal D output from the second signal source A2 that is an independent signal source.

Figure 7:
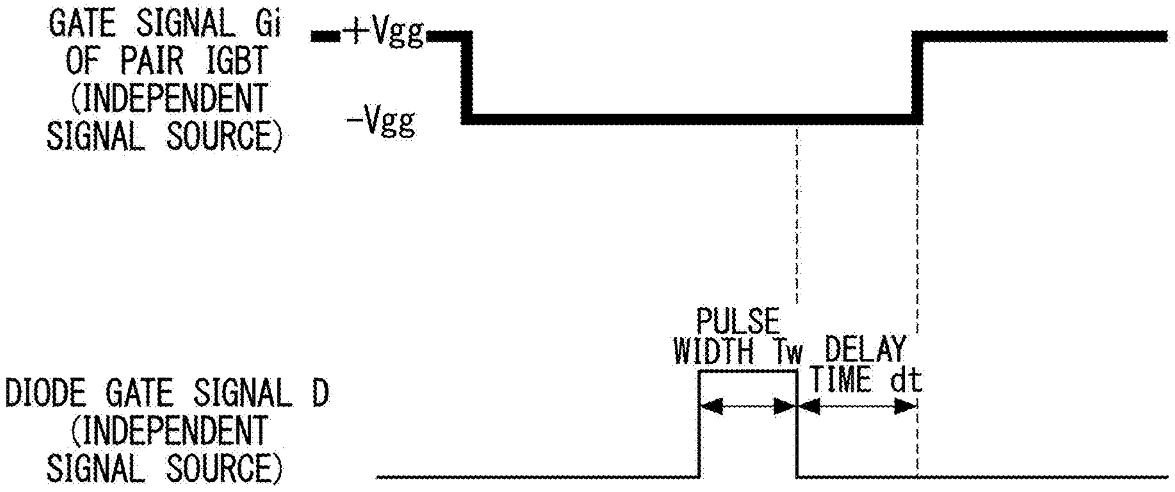
FIG. 7 illustrates waveforms of a diode gate signal and a gate signal of a pair IGBT in the first sequence.

FIG. 7 illustrates waveforms of the diode gate signal D and the gate signal Gi of the pair IGBT 201 in the first sequence. In FIG. 7, a time from when the diode gate signal D is turned OFF until the gate signal Gi is turned ON is defined as a delay time dt. Here, the delay time dt is 0 s or longer.

FIG. 8 is a circuit diagram of the gate-controlled diode 110 and its peripheral structure to be used in the second sequence. In other words, FIG. 8 is a circuit diagram of an electronic circuit including the gate-controlled diode 110. In the circuit of FIG. 8, a control circuit 301 is interposed between the second signal source A2 and the choke coil M1. The control circuit 301 receives the diode gate signal D from the second signal source A2, receives the gate signal Gi of the pair IGBT 201 from the first signal source A1, and outputs the diode gate control signal GD.

FIG. 9 illustrates a specific structure of the control circuit 301. The control circuit 301 includes a NOT gate 31 and an AND gate 32. The gate signal Gi of the pair IGBT 201 is input to an input terminal of the NOT gate 31. An output terminal of the NOT gate 31 is connected to one of input terminals of the AND gate 32. The diode gate signal D is input to the other input terminal of the AND gate 32. An output of the AND gate 32 is the diode gate control signal GD.

Figure 10:
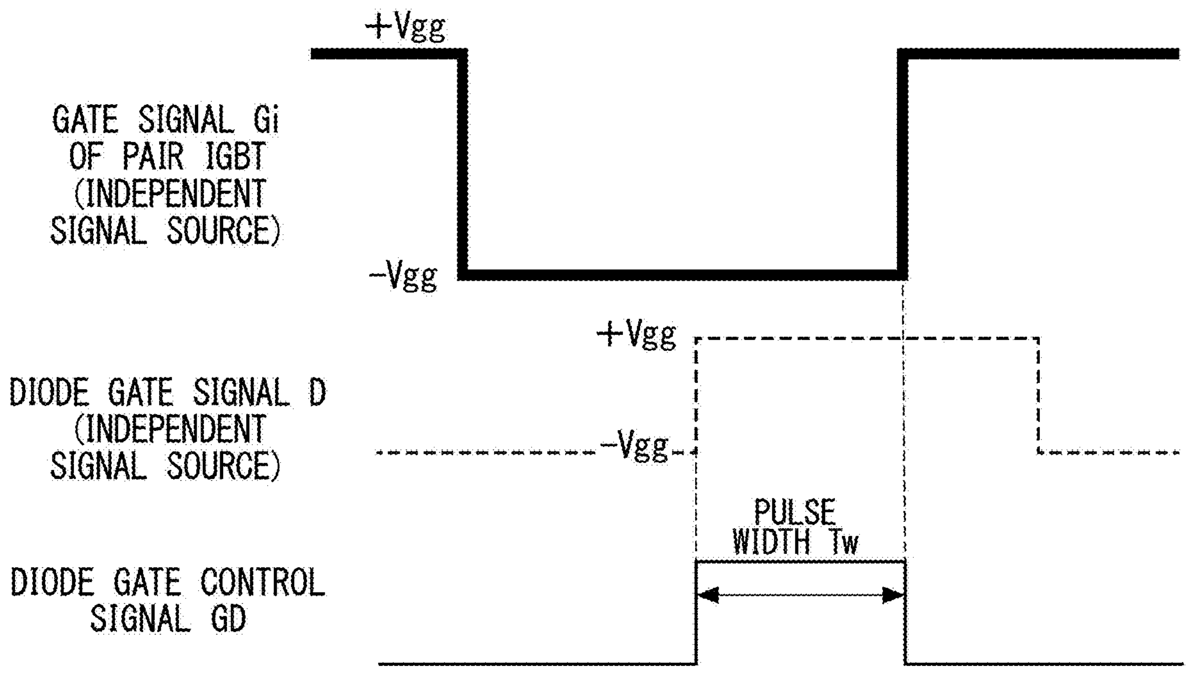
FIG. 10 illustrates waveforms of a gate signal of the pair IGBT, a diode gate signal, and a diode gate control signal in the second sequence.

FIG. 10 illustrates waveforms of the gate signal Gi of the pair IGBT 201, the diode gate signal D, and the diode gate control signal GD in the second sequence. When a fall of the diode gate signal D is delayed with respect to a rise of the gate signal Gi of the pair IGBT 201 in the second sequence, the diode gate control signal GD rises simultaneously with the rise of the gate signal Gi.

[B-3. Peak Concentration]

A tolerance of a peak concentration of each layer in the gate-controlled diode 110 will be described. A tolerance of a peak concentration of the $N^-$ type semiconductor substrate 1 ranges from $1.0\times10^{12}$ $cm^{-3}$ to $1.0\times10^{14}$ $cm^{-3}$. When the peak concentration of the $N^-$ type semiconductor substrate 1 deviates from this tolerance, for example, the breakdown voltage may decrease. A tolerance of a peak concentration of the P type channel layer 2 ranges from $1.0\times10^{15}$ $cm^{-3}$ to $1.0\times10^{17}$ $cm^{-3}$. When the peak concentration of the P type channel layer 2 exceeds the upper limit, the reverse recovery capability may decrease. When the peak concentration of the P type channel layer 2 falls below the lower limit, the gate-controlled diode 110 may not be able to conduct. The lower limit of the peak concentration of the $P^+$ type layer 3 is $1.0\times10^{17}$ $cm^{-3}$. The $N^+$ type layer 4 needs to be higher in peak concentration than the P type channel layer 2. The lower limit of the peak concentration of the N type buffer layer 8 is $1.0\times10^{15}$ $cm^{-3}$. When the peak concentration of the N type buffer layer 8 falls below the lower limit, for example, the breakdown voltage may decrease. The lower limit of the peak concentration of the $N^+$ type cathode layer 9 is $1.0\times10^{17}$ $cm^{-3}$. When the peak concentration of the $N^+$ type cathode layer 9 falls below the lower limit, the gate-controlled diode 110 may not be able to conduct. The peak concentration of the N type layer 11 needs to be higher than that of the $N^-$ type semiconductor substrate 1 and lower than that of the P type channel layer 2. When the peak concentration of the N type layer 11 exceeds the upper limit, the gate-controlled diode 110 may not be able to conduct.

[B-4. Advantages]

[B-4-1. Advantages of Increasing Tolerance of Gate Pulse Width Tw]

Figure 11:
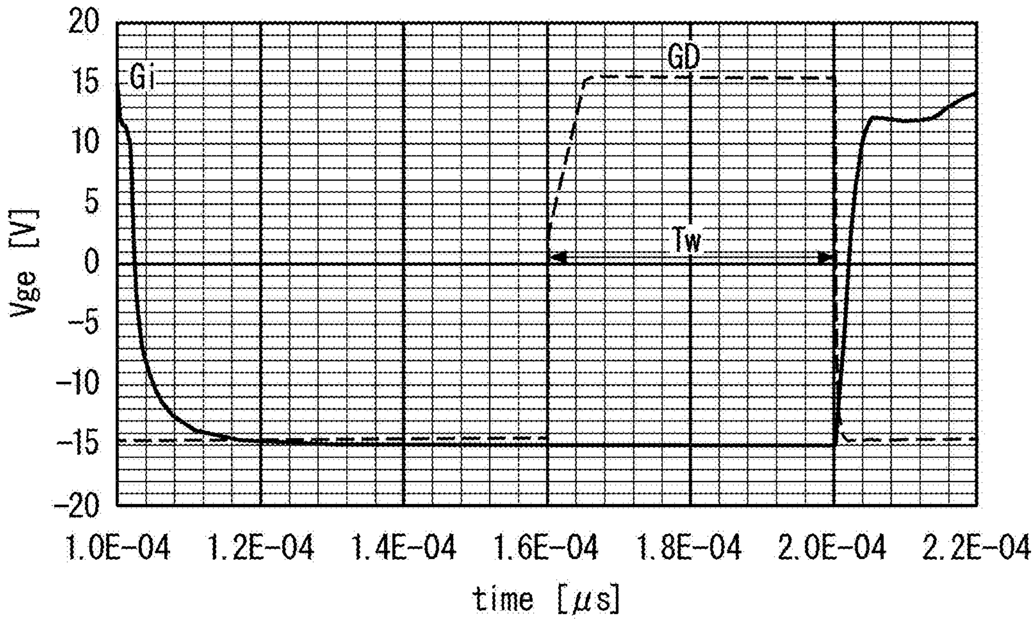
FIG. 11 illustrates waveforms of the gate signal of the pair IGBT and the diode gate control signal.
Figure 12:
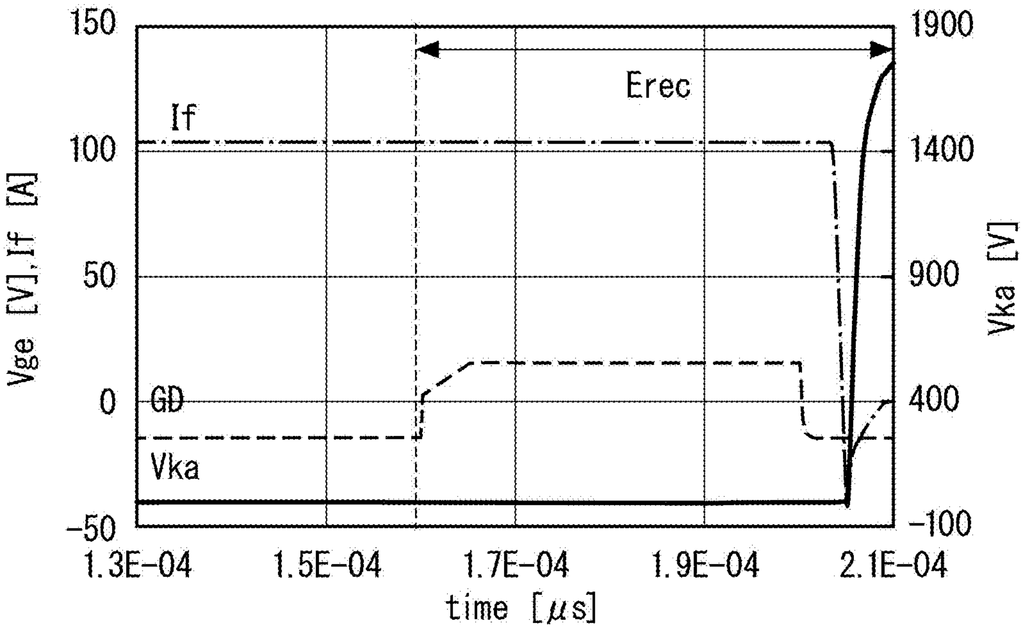
FIG. 12 illustrates a forward current of the gate-controlled diode, a cathode-to-anode voltage, and waveforms of the diode gate control signal.

FIGS. 11 and 12 illustrate representative examples of recovery waveforms. In FIG. 11, a solid line represents a waveform of the gate signal Gi of the pair IGBT 201, and a broken line represents a waveform of the diode gate control signal GD. FIG. 11 illustrates a period during which the diode gate control signal GD is input as the gate pulse width Tw.

In FIG. 12, an alternate long and short dashed line represents a forward current If of the gate-controlled diode 110, a solid line represents a cathode-to-anode voltage Vka, and a broken line represents a waveform of the diode gate control signal GD. The cathode-to-anode voltage Vka is obtained by subtracting an anode voltage from a cathode voltage. Losses of the gate-controlled diode 110 from turning ON of the diode gate control signal GD until turning OFF of the forward current If are defined as Erec. Specifically, Erec represents energy losses occurring when the gate-controlled diode 110 performs a recovery operation. FIG. 12 illustrates an Erec occurrence period using an arrow.

FIG. 13 illustrates a relationship between normalized Erec and Tw for each area percentage of the first active region RA1. An area percentage of the first active region RA1 is an area ratio of the first active region RA1 to the first active region RA1 and the second active region RA2. Since the gate-controlled diode 100 according to the underlying technology does not include the second active region RA2, the area percentage of the first active region RA1 is 100%.

FIG. 13 clarifies in the gate-controlled diode 100 according to the underlying technology that Erec decreases while the gate pulse width Tw is smaller and that Erec increases when the gate pulse width Tw is 20 us or more. In contrast, an increment of Erec is suppressed even when the gate pulse width Tw increases in the gate-controlled diode 110 according to Embodiment 1. Thus, the gate-controlled diode 110 can significantly obtain the effect of reducing recovery losses. In other words, the tolerance of the gate pulse width Tw in the gate-controlled diode 110 is increased more than that of the gate-controlled diode 100 according to the underlying technology. There was no effect of reducing recovery losses when the gate pulse width Tw=0 μs. Moreover, there was a tendency of a significant increase in the recovery losses when the gate pulse width Tw≥50 μs. Thus, the gate pulse width Tw is preferably 0 us or more and less than 50 μs.

A reduction rate of the recovery losses is higher as the area percentage of the first active region RA1 is increased from 20% to 80% under the same conditions of the gate pulse width Tw. When the area percentage of the first active region RA1 is less than 20%, the effect of significantly reducing recovery losses cannot be obtained. When the area percentage of the first active region RA1 exceeds 80%, the effect of reducing recovery losses dramatically worsens. Thus, the area percentage of the first active region RA1 is preferably 20% or higher and 80% or lower.

[B-4-2. Mechanism of Increasing Tolerance of Gate Pulse Width Tw]

Figure 14:
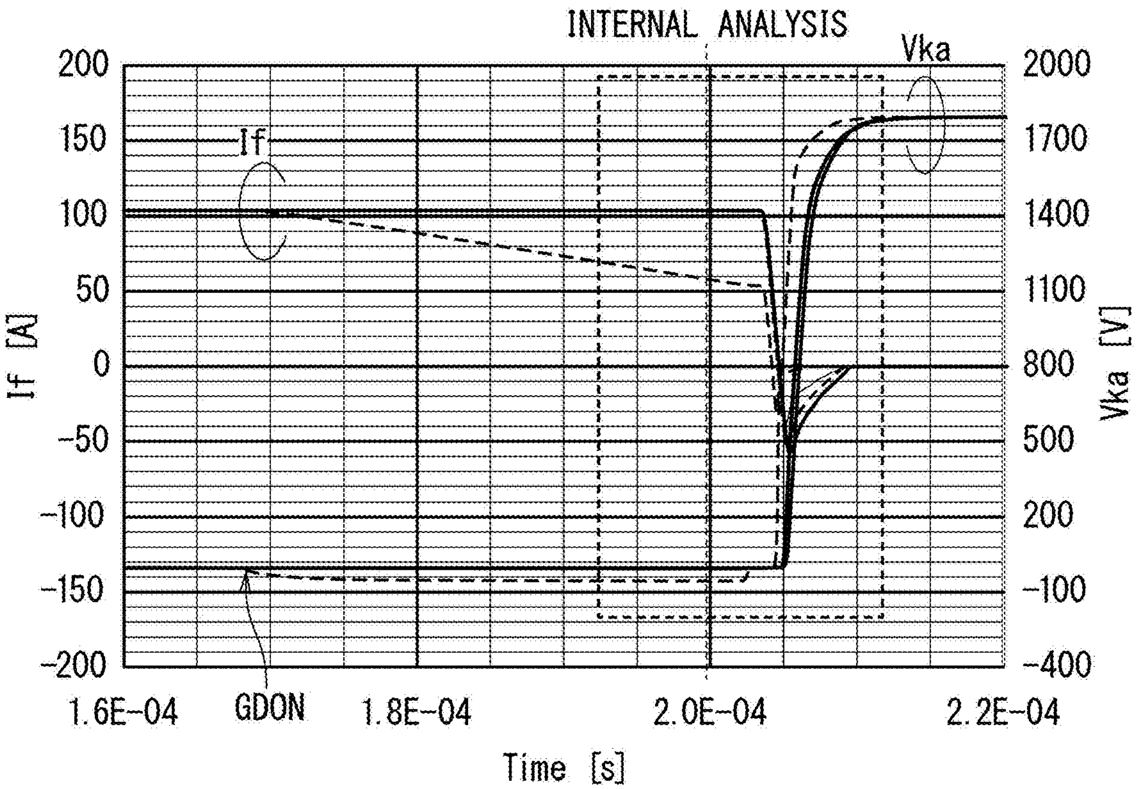
FIG. 14 illustrates waveforms of the forward current and the cathode-to-anode voltage.
Figure 15:
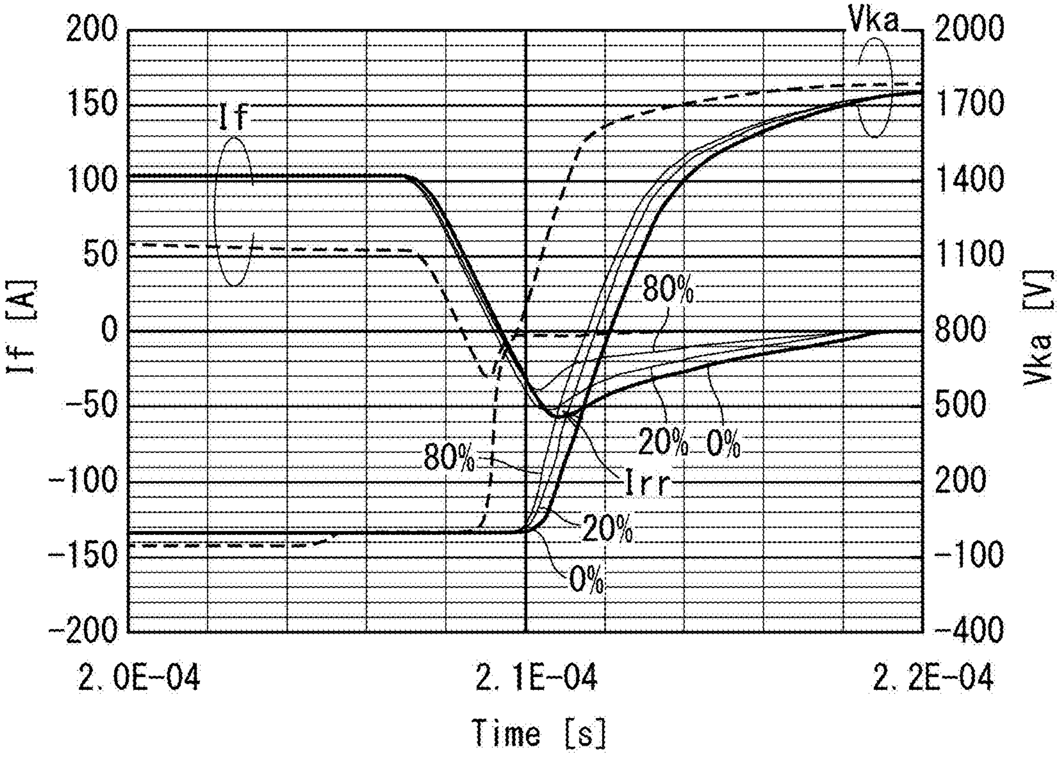
FIG. 15 is an enlarged view of a dotted-line portion in FIG. 14.
Figure 16:
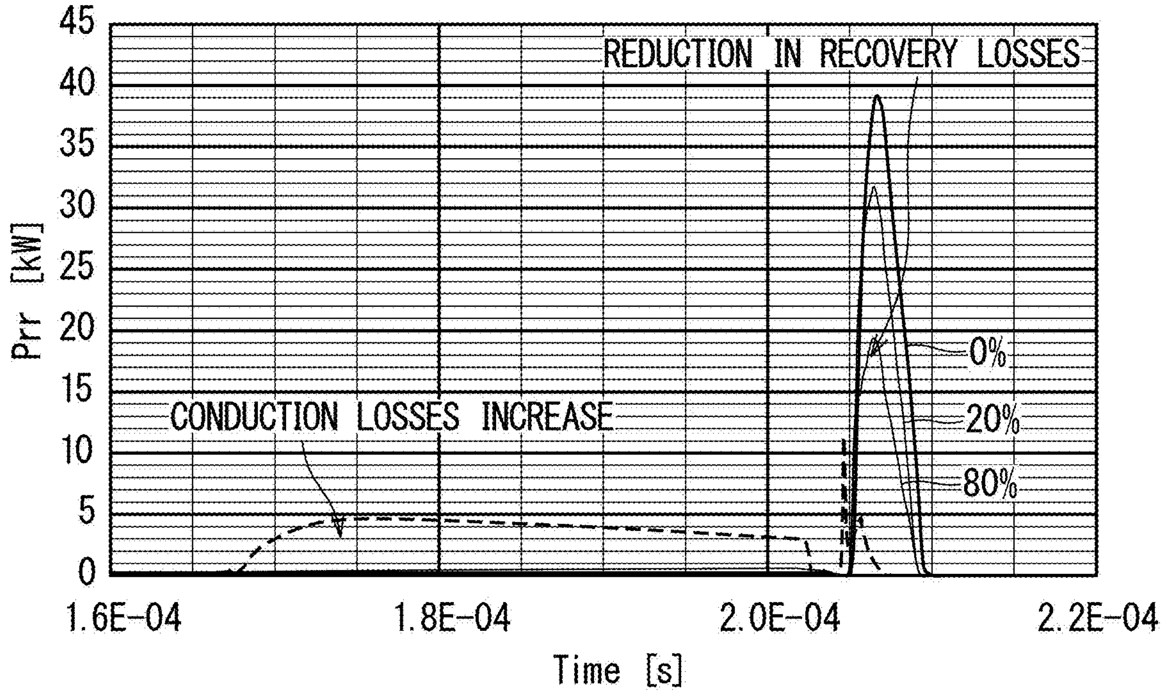
FIG. 16 illustrates waveforms of recovery power.

FIGS. 14 to 16 illustrate recovery waveforms of the gate-controlled diode 110 when the gate pulse width Tw is 30 μs. In these diagrams, a dotted line represents a case where the area percentage of the first active region RA1 is 100%, and a solid line represents a case where the area percentage of the first active region RA1 is 0%, 20%, or 80%. FIG. 14 illustrates waveforms of the forward current If and a cathode-to-anode voltage Vka, and FIG. 15 is an enlarged view of a dotted-line portion in FIG. 14. FIG. 16 illustrates waveforms of recovery power Prr.

We found that the reverse recovery maximum current Irr decreases and Erec losses decrease when the area percentage of the first active region RA1 increases from 0% to 80%. In contrast, although the reverse recovery maximum current Irr decreases in the structure according to the underlying technology where the area percentage of the first active region RA1 is 100%, the cathode-to-anode voltage Vka increases in a negative direction upon turning ON of the diode gate control signal GD. In other words, an increase in a conducting voltage obtained by subtracting the cathode voltage from the anode voltage and an increase in the conduction losses are clarified.

Figure 17:
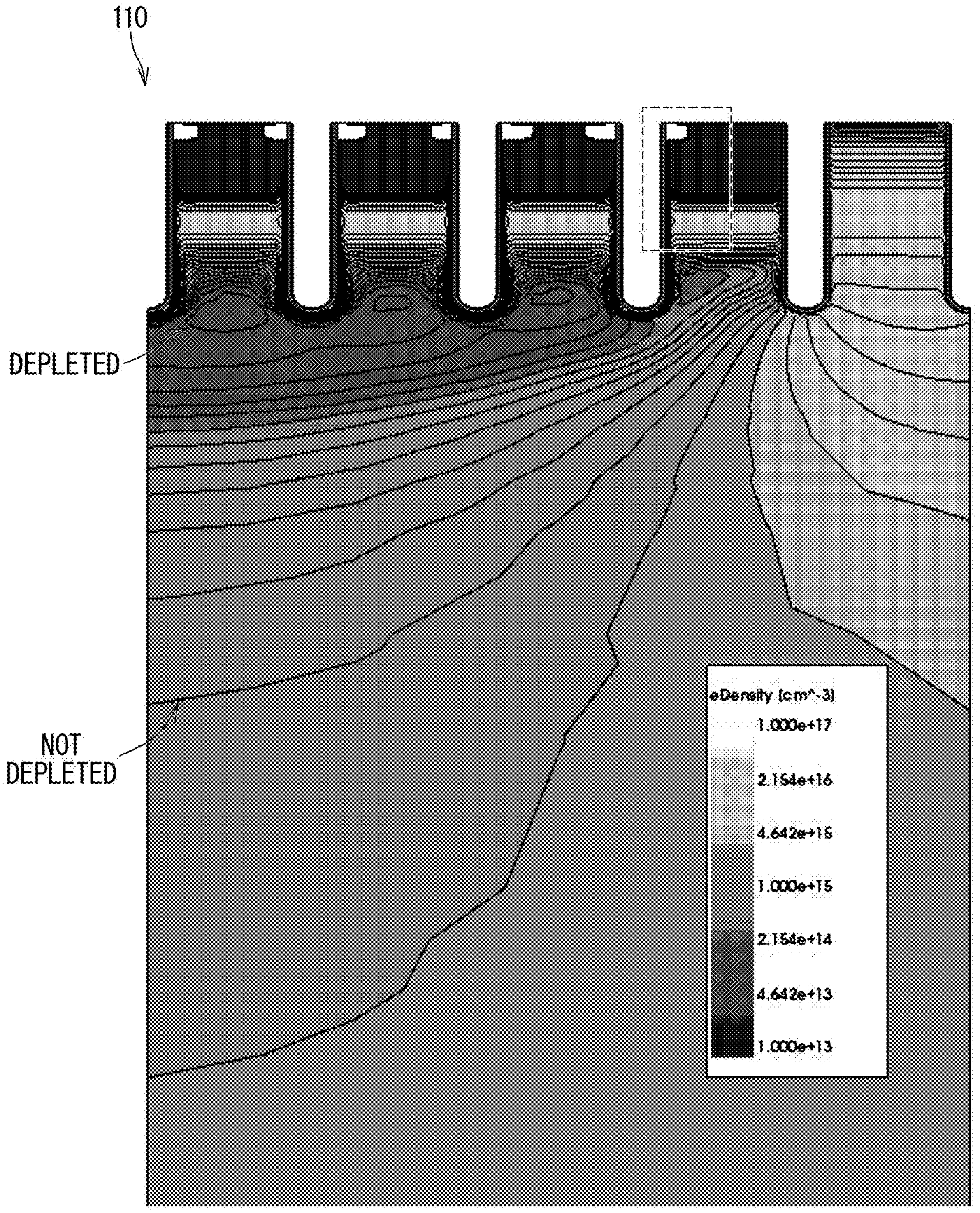
FIG. 17 illustrates analysis results of an electron distribution during a recovery operation on the gate-controlled diode according to Embodiment 1.
Figure 18:
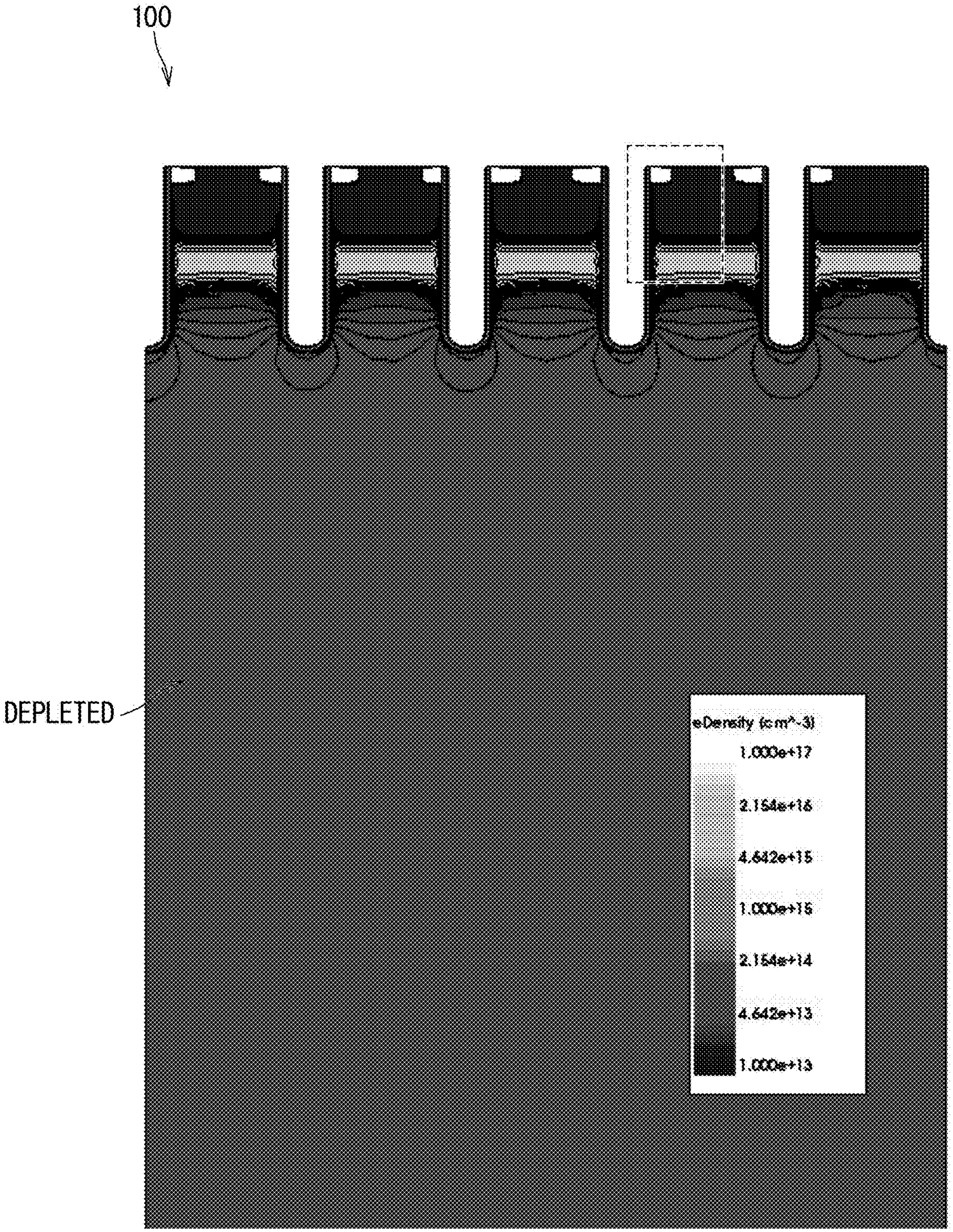
FIG. 18 illustrates an electron distribution during a recovery operation on the gate-controlled diode according to the underlying technology.
Figure 19:
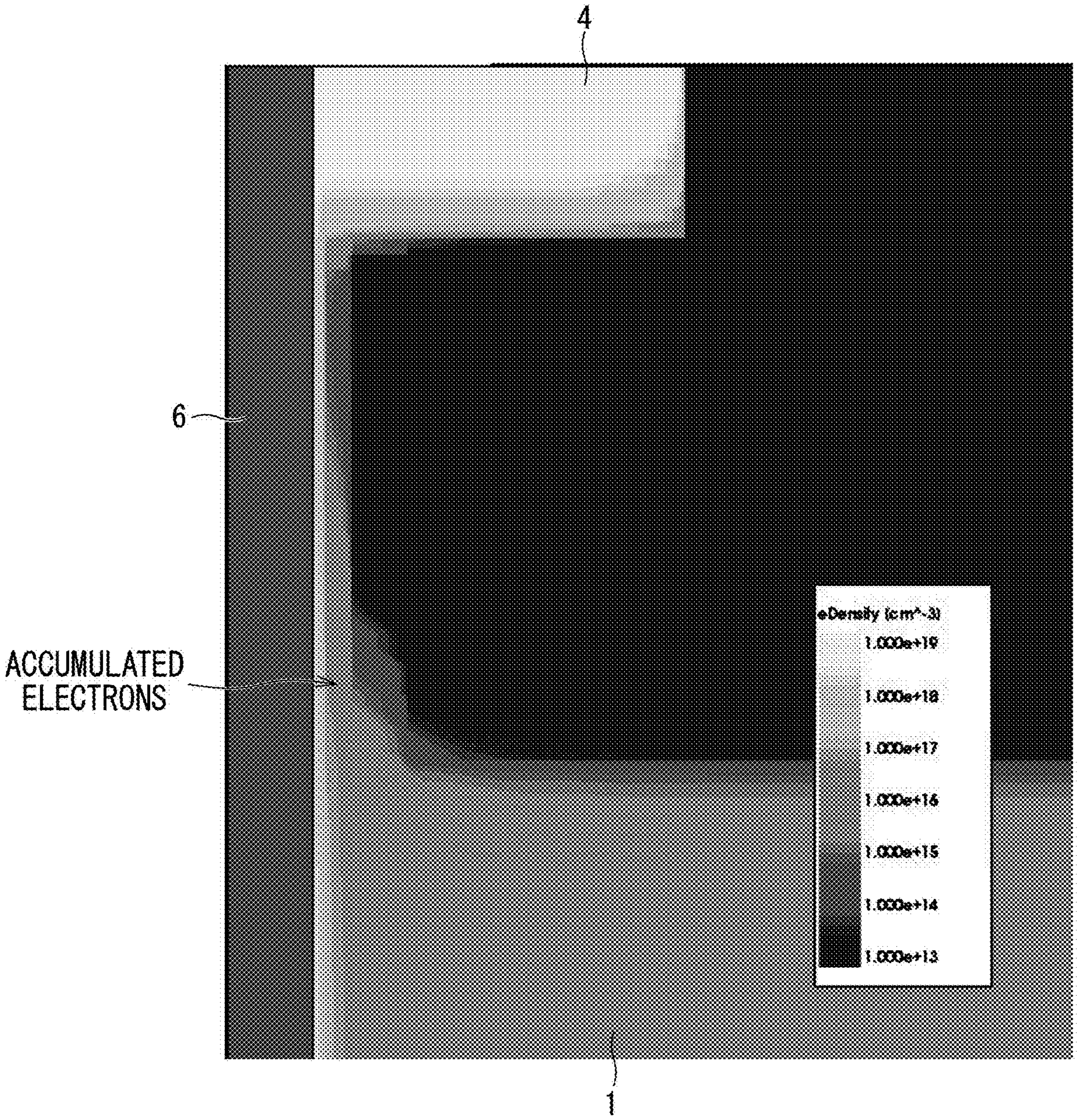
FIG. 19 is an enlarged view of a dotted-line portion in FIG. 17.
Figure 21:
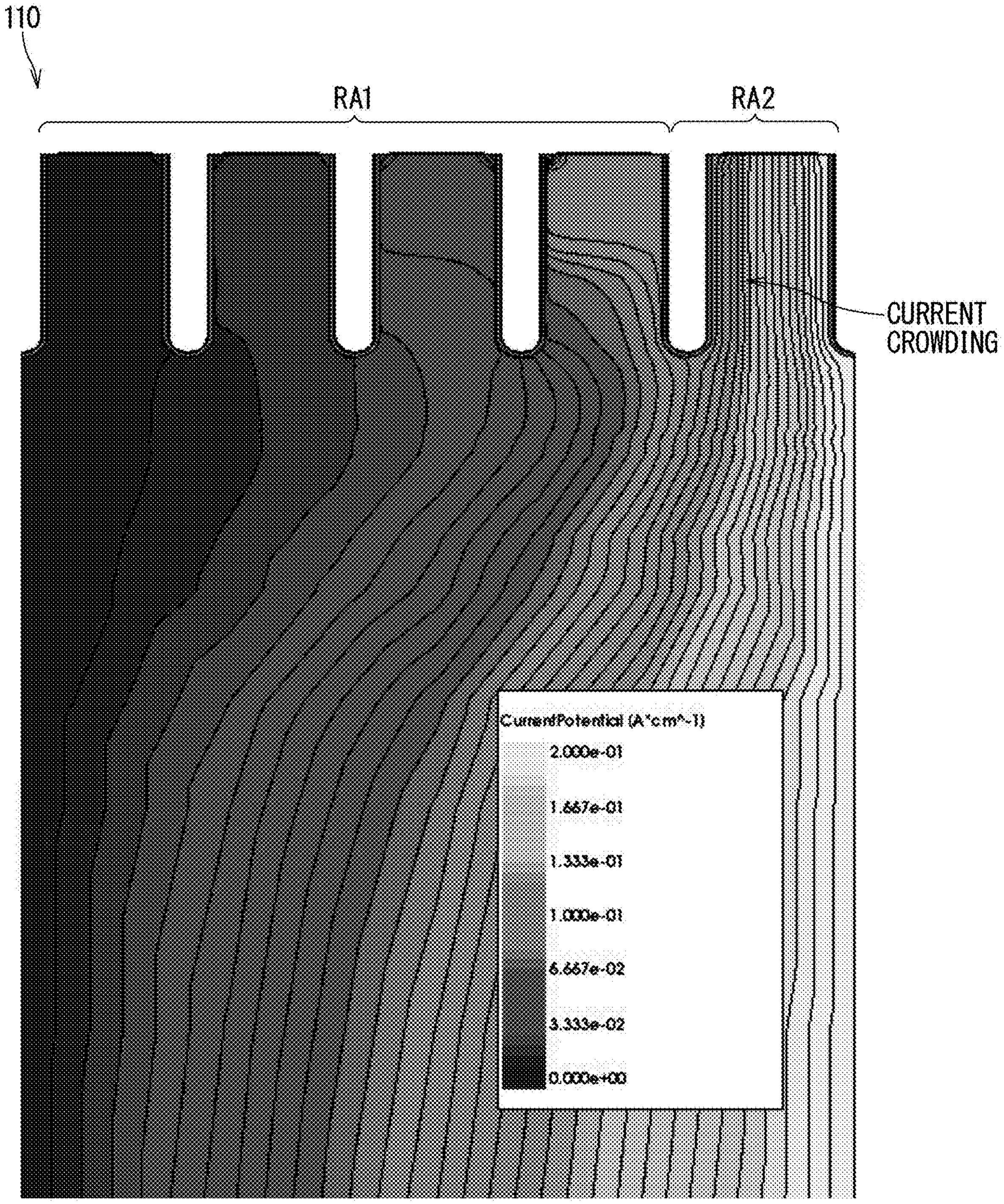
FIG. 21 illustrates a current distribution during the recovery operation on the gate-controlled diode according to Embodiment 1.
Figure 22:
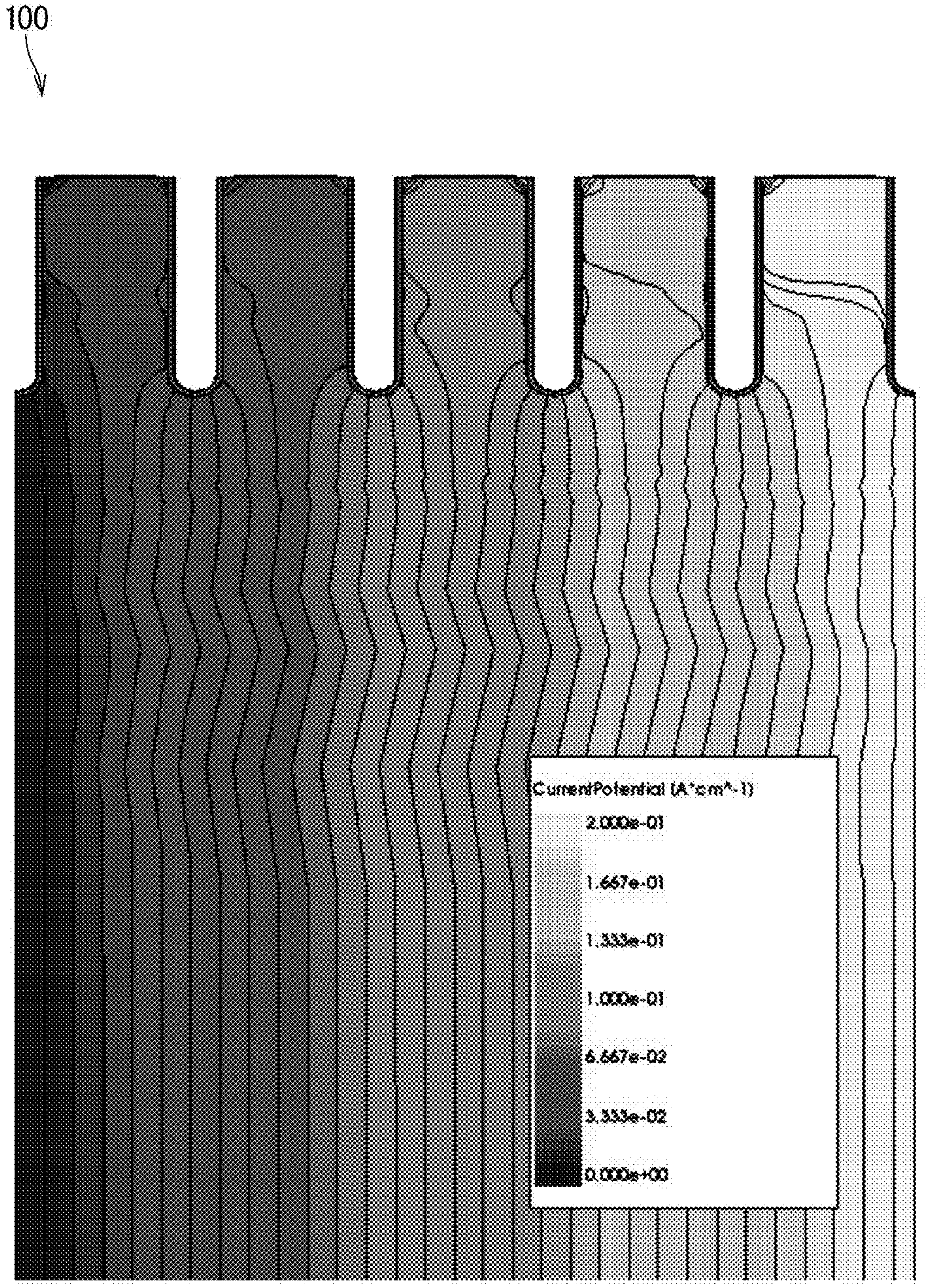
FIG. 22 illustrates a current distribution during the recovery operation on the gate-controlled diode according to the underlying technology.

FIGS. 17 to 22 illustrate results of 2D internal analysis on the gate-controlled diode 110 according to Embodiment 1 and the gate-controlled diode 100 according to the underlying technology. FIGS. 17, 19, and 21 illustrate the analysis results on the gate-controlled diode 110 in which the area percentage of the first active region RA1 is 80%. FIGS. 18, 20, and 22 illustrate the analysis results on the gate-controlled diode 100 according to the underlying technology. FIGS. 17 and 18 each illustrate an electron distribution during a recovery operation. FIG. 19 and FIG. 20 are enlarged views of dotted-line portions in FIG. 17 and FIG. 18, respectively. FIGS. 21 and 22 each illustrate a current distribution during a recovery operation. As illustrated in FIG. 14, the time of the internal analysis is $t=2.0\times10^{-4}$ s.

FIGS. 17 to 20 clarify that electrons are accumulated in the oxide film 6 closer to the P type channel layer 2 in the MOSFET on the anode side upon turning ON of the diode gate control signal GD, in both of the gate-controlled diode 110 according to Embodiment 1 and the gate-controlled diode 100 according to the underlying technology. An electron accumulation layer short-circuits not only the $N^+$ type layer 4, the N type layer 11, and the $N^-$ type semiconductor substrate 1, but also a p-n junction between the P type channel layer 2 and the $N^-$ type semiconductor substrate 1, so that the gate-controlled diode cannot conduct. Since holes are not injected from the P type channel layer 2, a depletion layer extends from the anode side of the first active region RA1.

Since the p-n junction in the second active region RA2 is normally conducting in the gate-controlled diode 110 according to Embodiment 1, a depletion layer does not extend, and a low conducting voltage of the diode can be maintained. Thus, there is no increase in the conduction losses.

When the gate is turned ON in the gate-controlled diode 100 according to the underlying technology, depletion layers extend from all regions on the anode side as illustrated in FIG. 18, and regions of high resistance are generated in all of the regions. Since a current flows through the regions of high resistance, the conduction losses increase. As indicated by a dotted line in FIG. 16, the conduction losses in the gate-controlled diode 100 according to the underlying technology are actually large. Since a decrease in recovery losses is offset by an increase in conduction losses in the gate-controlled diode 100 according to the underlying technology, an effect of improving the characteristics cannot be obtained.

[B-4-3. Tolerance of Delay Time Dt]

In the first sequence illustrated in FIGS. 6 and 7, not only the gate signal Gi of the pair IGBT 201 but also the diode gate signal D are from independent signal sources. To prevent malfunctions, the delay time dt from when the diode gate signal D is turned OFF until the gate signal Gi is turned ON needs to be set to 0 s or longer.

When the gate-controlled diode 110 performs a recovery operation, the pair IGBT 201 performs an ON operation with reference to FIG. 8. When the pair IGBT 201 is turned OFF, a current flows between the gate-controlled diode 110 and a load inductance Lm because of no electrical path from the power supply Vcc to the GND. When the pair IGBT 201 is turned ON, an electrical path is formed from the power supply Vcc to the GND, and a current flows between the load inductance Lm and the pair IGBT 201.

When the gate of the pair IGBT 201 is turned ON and the gate of the gate-controlled diode 110 is turned OFF, the current from the power supply Vcc does not pass through the gate-controlled diode 110 as described above. When the gate of the pair IGBT 201 is turned ON and the gate of the gate-controlled diode 110 is also turned ON, the $N^+$ type layer 4, the N type layer 11, and the $N^-$ type semiconductor substrate 1 are short-circuited through the electron accumulation layer. Thus, the current from the power supply Vcc flows from the cathode side to the anode side, and the circuit malfunctions. To prevent this malfunction, the delay time dt needs to be set to 0 s or longer.

Figure 23:
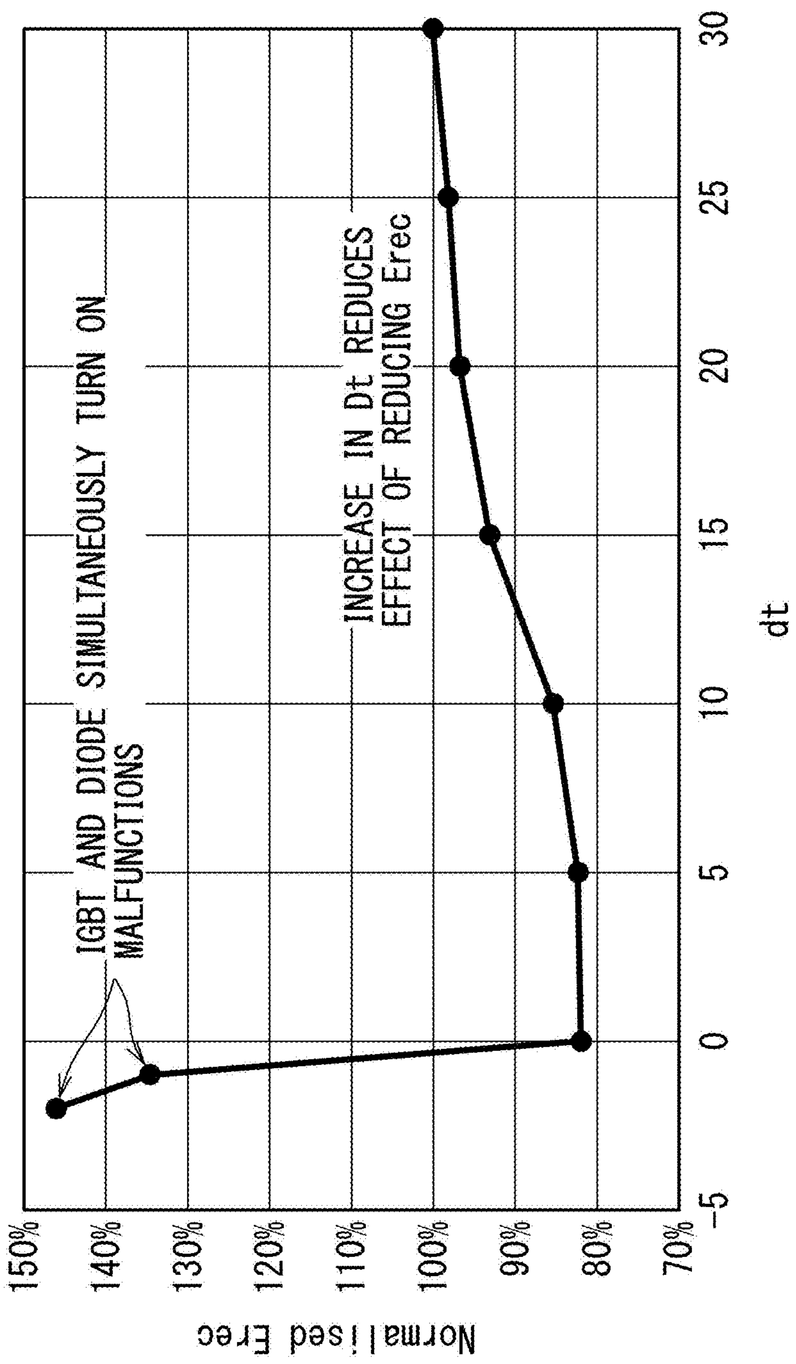
FIG. 23 illustrates dependence of Erec on dt.

FIG. 23 illustrates dependence of Erec on dt. FIG. 23 clarifies that when dt increases, holes are injected again from the p-n junction on the anode side and the effect of reducing recovery losses in the gate-controlled diode 110 weakens. Thus, dt is preferably a value closer to 0 s as much as possible to obtain the effect of reducing recovery losses.

In the second sequence illustrated in FIGS. 8 to 10, the gate of the gate-controlled diode 110 is controlled not by an independent signal source but by both of the gate signal Gi of the pair IGBT 201 and the diode gate signal D. When the gate signal Gi of the pair IGBT 201 is turned ON by the control circuit 301, the diode gate control signal GD is always turned OFF. This can consequently exert the effect of reducing recovery losses while preventing malfunctions.

[B-5. Modifications]

The distinctive structure of the gate-controlled diode 110 described in Embodiment 1 is applicable to a p-i-n diode with a gate structure of an anode-type MOSFET, for example, to an RC-IGBT. This p-i-n diode can produce the same advantages.

Although the gate-controlled diode 110 belongs to, for example, a 3300 V high-breakdown-voltage class, it may belong to another breakdown-voltage class.

Figure 24:
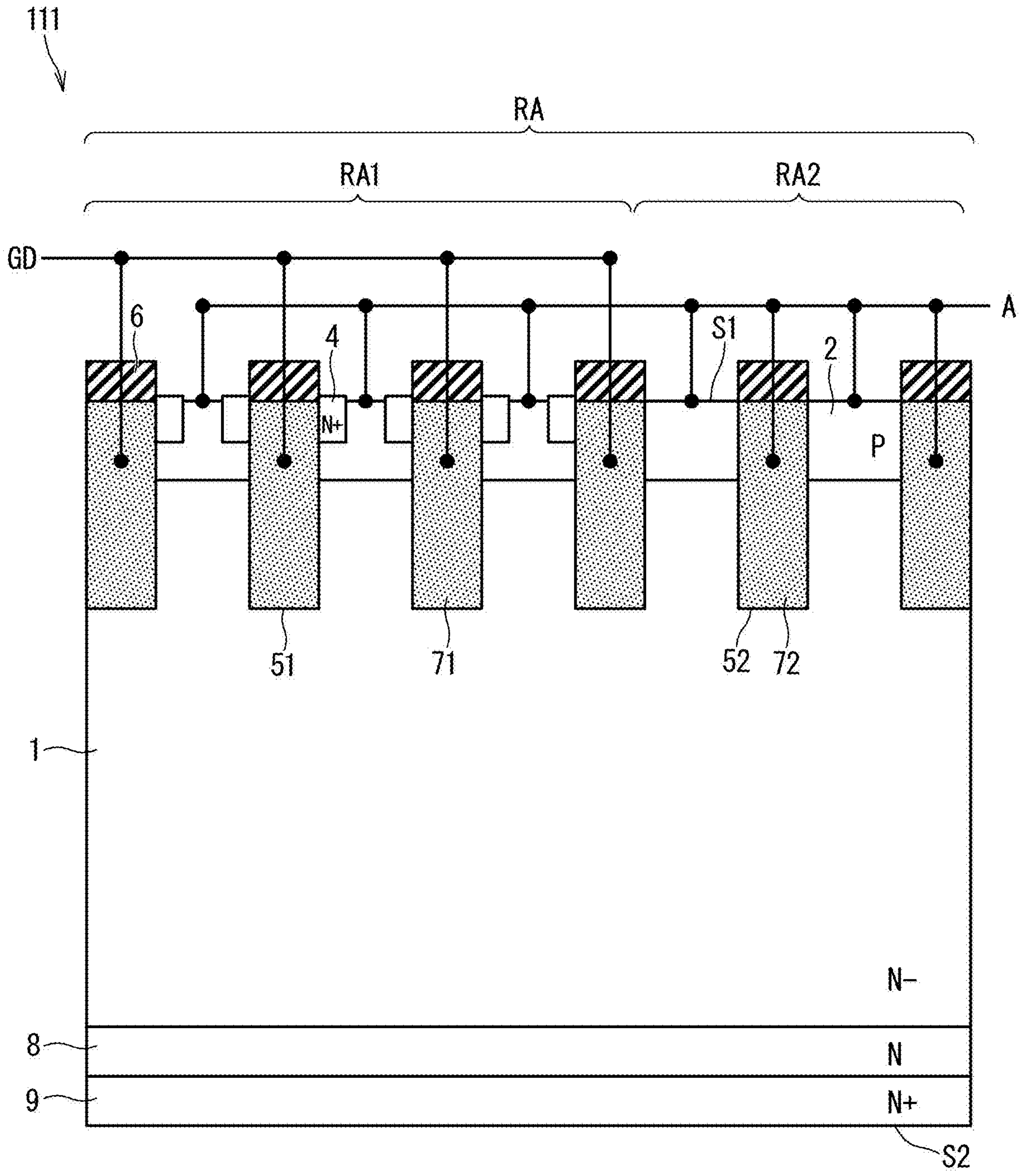
FIG. 24 is a cross-sectional view of a gate-controlled diode according to a first modification of Embodiment 1.

FIG. 24 is a cross-sectional view of a gate-controlled diode 111 according to a first modification of Embodiment 1. The gate-controlled diode 111 differs from the gate-controlled diode 110 according to Embodiment 1 by not including the N type layer 11. Since the gate-controlled diode 111 does not include the N type layer 11, holes are easily injected from an anode p-n junction, and characteristics of the diode are shifted to low speeds. The N type layer 11 may be partially formed.

FIG. 25 is a cross-sectional view of a gate-controlled diode 112 according to a second modification of Embodiment 1. The gate-controlled diode 112 differs from the gate-controlled diode 110 in that partial regions of the $N^+$ type cathode layer 9 become P type cathode layers 10 and the $N^+$ type cathode layer 9 and the P type cathode layer 10 are alternately disposed in a plane direction vertical to a thickness direction of the gate-controlled diode 112. The P type cathode layers 10 can produce an effect of suppressing recovery oscillations. The p-type impurity concentration of the P type cathode layers 10 is preferably higher than the n-type impurity concentration of the N type buffer layer 8.

Figure 26:
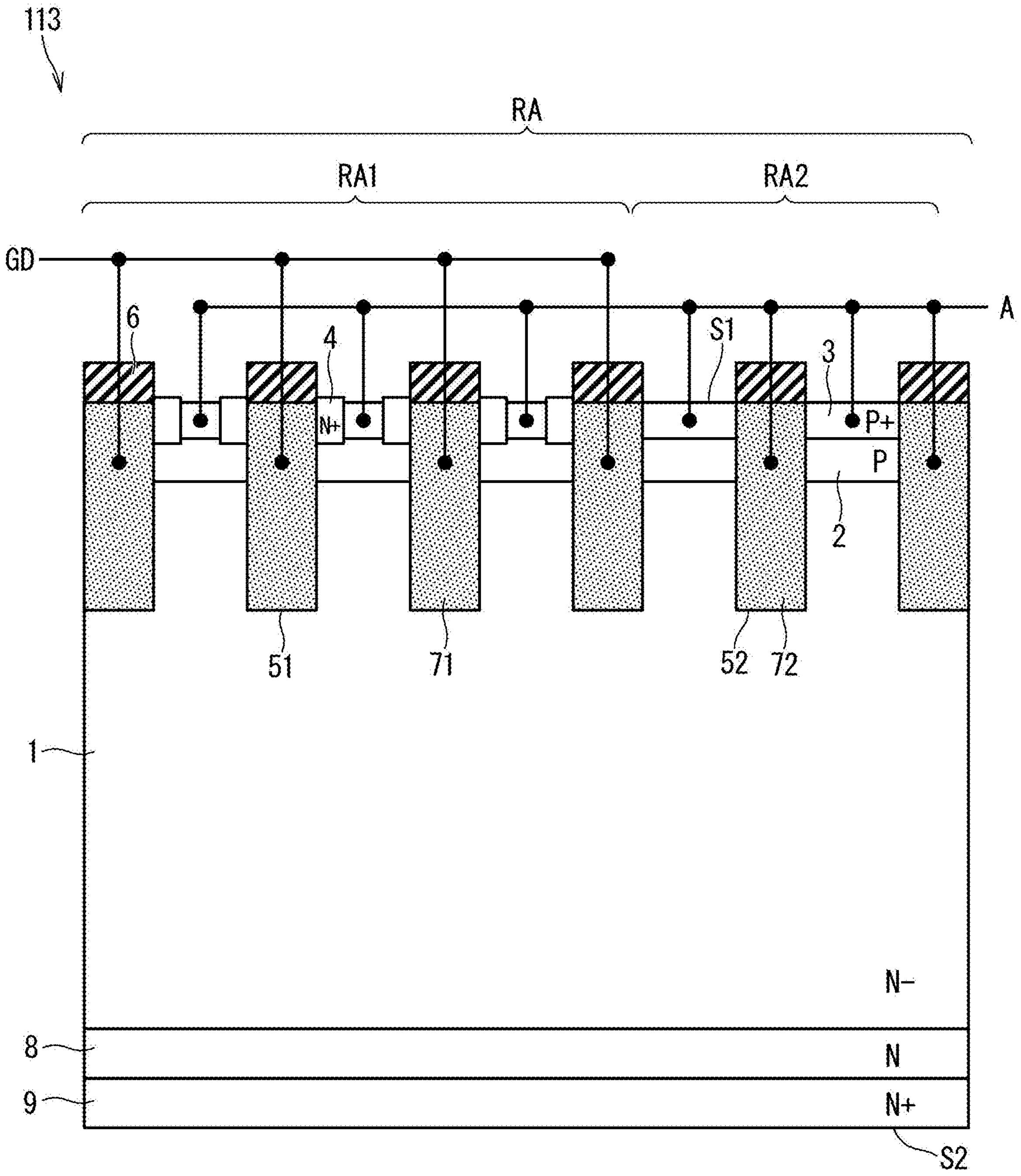
FIG. 26 is a cross-sectional view of a gate-controlled diode according to a third modification of Embodiment 1.

FIG. 26 is a cross-sectional view of a gate-controlled diode 113 according to a third modification of Embodiment 1. The gate-controlled diode 113 differs from the gate-controlled diode 110 by including the $P^+$ type layer 3 in the surface layer of the P type channel layer 2 in the first active region RA1 and the second active region RA2. The upper surface of the $P^+$ type layer 3 makes up the first main surface S1 of the $N^-$ type semiconductor substrate 1. The $P^+$ type layer 3 improves ohmic contact properties of a contact on the anode side. The $P^+$ type layer 3 may be partially formed or have different impurity concentrations between the first active region RA1 and the second active region RA2.

In Embodiment 1 and its modifications, the P type channel layer 2 may be partially formed or have different impurity concentrations between the first active region RA1 and the second active region RA2.

Although preferred embodiments are described above in detail, various modifications and replacements can be added to Embodiment 1, etc. without being limited to Embodiment 1, etc. and without departing from claims.

While the disclosure has been shown and described in detail, the foregoing description is in all aspects illustrative and not restrictive. It is therefore understood that numerous modifications and variations can be devised.

What is claimed is:

1. A gate-controlled diode, comprising:
a semiconductor substrate of a first conductivity type;
an active region formed in a first main surface of the semiconductor substrate;
a cathode layer of the first conductivity type formed in a second main surface of the semiconductor substrate, the second main surface being a main surface opposite to the first main surface; and
a buffer layer of the first conductivity type formed between the cathode layer and the semiconductor substrate,
wherein the active region is divided into a first active region and a second active region in a plan view,
the gate-controlled diode, further comprising:
a plurality of first trenches formed at regular intervals in the first main surface of the semiconductor substrate in the first active region;
a diode gate electrode buried in each of the first trenches through an oxide film;
a plurality of second trenches formed at regular intervals in the first main surface of the semiconductor substrate in the second active region;
an anode electrode buried in each of the second trenches through the oxide film;
a channel layer of a second conductivity type formed in a surface layer of the semiconductor substrate between adjacent two of the first trenches and between adjacent two of the second trenches, the channel layer being electrically connected to the anode electrode; and
a layer of the first conductivity type formed in a surface layer of the channel layer in the first active region,
wherein an area of the first active region is 20% or higher and 80% or lower of a sum of the area of the first active region and an area of the second active region.

2. The gate-controlled diode according to claim 1,
wherein the anode electrode is connected to a collector electrode of a pair insulated-gate bipolar transistor, and
a delay time from when a diode gate control signal to be input to the diode gate electrode is turned OFF until a gate signal to be input to a gate electrode of the pair insulated-gate bipolar transistor is turned ON is 0 or longer.

3. The gate-controlled diode according to claim 2,
wherein a gate pulse width of the diode gate control signal is 0 μs or more and less than 50 μs.

4. An electronic circuit, comprising:
the gate-controlled diode according to claim 2;
the pair insulated-gate bipolar transistor that is an insulated-gate bipolar transistor connected to the anode electrode of the gate-controlled diode;
a first signal source that supplies a gate signal to the gate electrode of the pair insulated-gate bipolar transistor;
a second signal source that outputs a diode gate signal, independently from the first signal source; and a control circuit that produces the diode gate control signal, based on the gate signal and the diode gate signal, the control circuit including:

a NOT gate receiving the gate signal; and an AND gate receiving an output of the NOT gate as one input and receiving the diode gate signal as an other input, wherein an output of the AND gate is the diode gate control signal.

5. The electronic circuit according to claim 4, wherein a pulse width of the diode gate signal is 0 μs or more and less than 50 μs.

* * * * *